(12) United States Patent
Okuyama et al.

(10) Patent No.: US 11,561,423 B2
(45) Date of Patent: Jan. 24, 2023

(54) DISPLAY DEVICE INCLUDING A LIQUID CRYSTAL LAYER INCLUDING STREAKY POLYMERS AND LIQUID CRYSTAL MOLECULES

(71) Applicant: Japan Display Inc., Minato-ku (JP)

(72) Inventors: Kentaro Okuyama, Tokyo (JP); Yoshihide Ohue, Tokyo (JP); Hiroki Sugiyama, Tokyo (JP); Tomoyuki Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/689,219

(22) Filed: Nov. 20, 2019

(65) Prior Publication Data
US 2020/0166796 A1     May 28, 2020

(30) Foreign Application Priority Data

Nov. 22, 2018  (JP) .............................. JP2018-219297

(51) Int. Cl.
  *G02F 1/1333*    (2006.01)
  *H01L 27/12*     (2006.01)
  (Continued)

(52) U.S. Cl.
  CPC ...... *G02F 1/133345* (2013.01); *G02F 1/1334* (2013.01); *G02F 1/1368* (2013.01);
  (Continued)

(58) Field of Classification Search
  CPC combination set(s) only.
  See application file for complete search history.

(56) References Cited

U.S. PATENT DOCUMENTS 5,850,271 A * 12/1998 Kim .................. G02F 1/133512
                                                        349/111
6,577,374 B1    6/2003 Nakata et al.
(Continued)

FOREIGN PATENT DOCUMENTS

JP      2009-210967 A      9/2009
JP      2017-167214 A      9/2017
(Continued)

OTHER PUBLICATIONS

Office Action dated Mar. 2, 2022 in Chinese Application No. 201911149463.3 (machine translation), citing Chinese reference corresponding to document AA cited above.
(Continued)

*Primary Examiner* — Lauren Nguyen
(74) *Attorney, Agent, or Firm* — Maier & Maier, PLLC

(57) ABSTRACT

According to one embodiment, a display device includes a first substrate, a second substrate, a liquid crystal layer including polymers and liquid crystal molecules, and a light-emitting element. The first substrate includes a transparent substrate, a scanning line, a signal line crossing the scanning line, a switching element electrically connected to the scanning line and the signal line, an organic insulating film overlapping the switching element, and a pixel electrode electrically connected to the switching element. A thickness of the organic insulating film located between the transparent substrate and the pixel electrode is less than a thickness of the organic insulating film overlapping the switching element.

10 Claims, 18 Drawing Sheets

(51) Int. Cl.
  *G02F 1/1368* (2006.01)
  *G02F 1/1339* (2006.01)
  *G02F 1/1335* (2006.01)
  *G02F 1/1362* (2006.01)
  *G02F 1/13357* (2006.01)
  *G02F 1/1334* (2006.01)

(52) U.S. Cl.
  CPC .... *G02F 1/13394* (2013.01); *G02F 1/133512* (2013.01); *G02F 1/133615* (2013.01); *G02F 1/136213* (2013.01); *G02F 1/136286* (2013.01); *H01L 27/124* (2013.01); *H01L 27/1248* (2013.01); *H01L 27/1255* (2013.01); *G02F 1/13347* (2021.01); *G02F 1/133365* (2013.01); *G02F 1/136227* (2013.01); *G02F 2203/03* (2013.01)

(56) References Cited

U.S. PATENT DOCUMENTS

| | | | |
|---|---|---|---|
| 10,416,493 B2 | 9/2019 | Mizuno et al. | |
| 2002/0149018 A1 | 10/2002 | Hirata | |
| 2004/0109101 A1* | 6/2004 | Kim | G02F 1/136209 349/44 |
| 2008/0036959 A1* | 2/2008 | Yang | G02F 1/13394 349/155 |
| 2009/0237600 A1* | 9/2009 | Nagai | G02F 1/133555 349/114 |
| 2012/0069063 A1* | 3/2012 | Sato | H04N 13/356 345/690 |
| 2013/0235292 A1 | 9/2013 | Hara et al. | |
| 2016/0147109 A1* | 5/2016 | Yamazaki | H01L 51/5246 349/42 |
| 2017/0255072 A1 | 9/2017 | Kaneko et al. | |
| 2019/0004377 A1* | 1/2019 | Okuyama | G02F 1/133345 |
| 2019/0041673 A1 | 2/2019 | Numata et al. | |
| 2019/0079323 A1 | 3/2019 | Kurokawa et al. | |
| 2019/0101803 A1 | 4/2019 | Numata et al. | |
| 2019/0294012 A1 | 9/2019 | Okuyama et al. | |

FOREIGN PATENT DOCUMENTS

| | | |
|---|---|---|
| KR | 10-0552281 B1 | 5/2006 |
| WO | WO 2019/138824 A1 | 7/2019 |

OTHER PUBLICATIONS

Japanese Office Action dated Jun. 7, 2022 in Japanese Patent Application No. 2018-219297 (submitting unedited computer generated English translation), citing documents AA thorough AD, AO and AP therein, 5 pages.

* cited by examiner

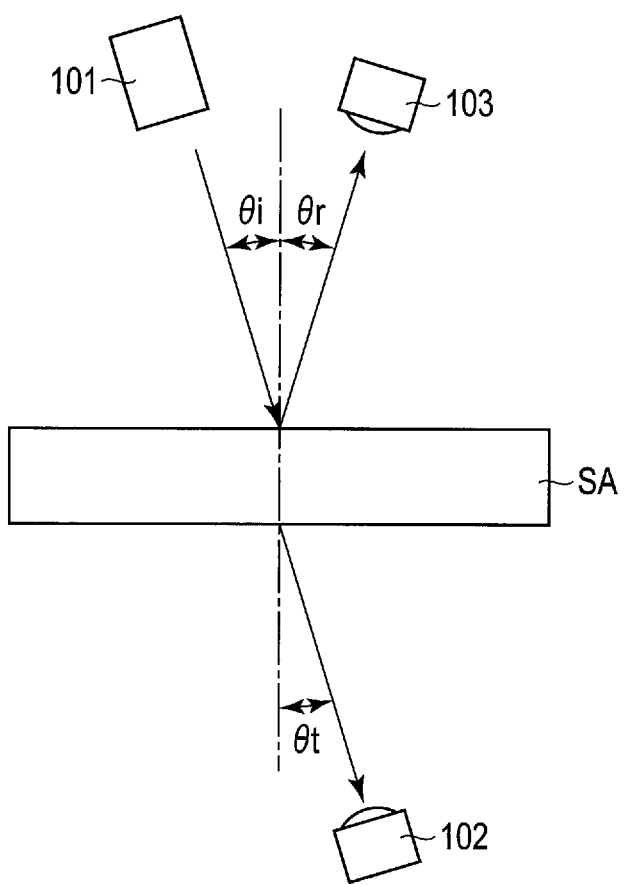
F I G. 15

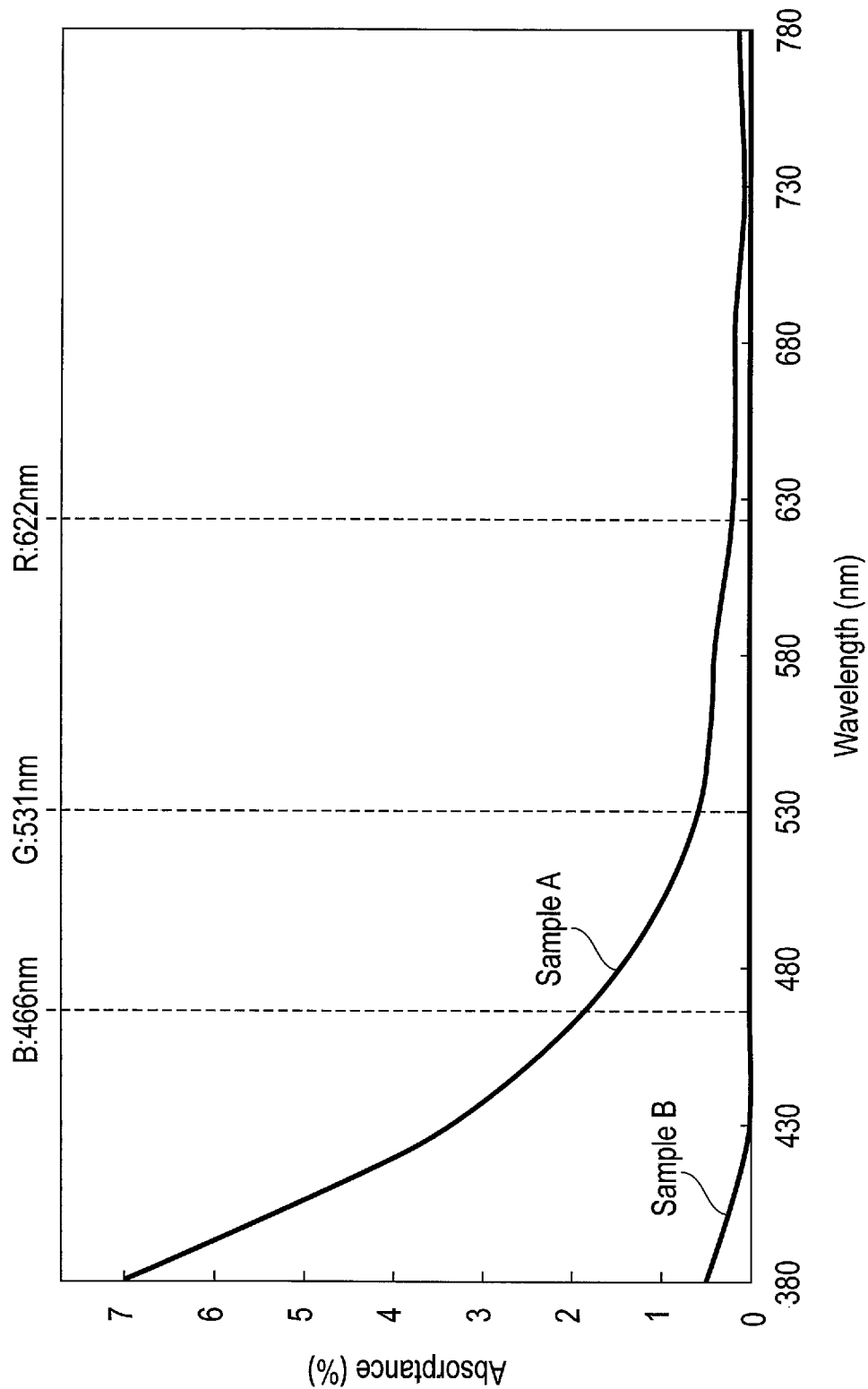
F I G. 16

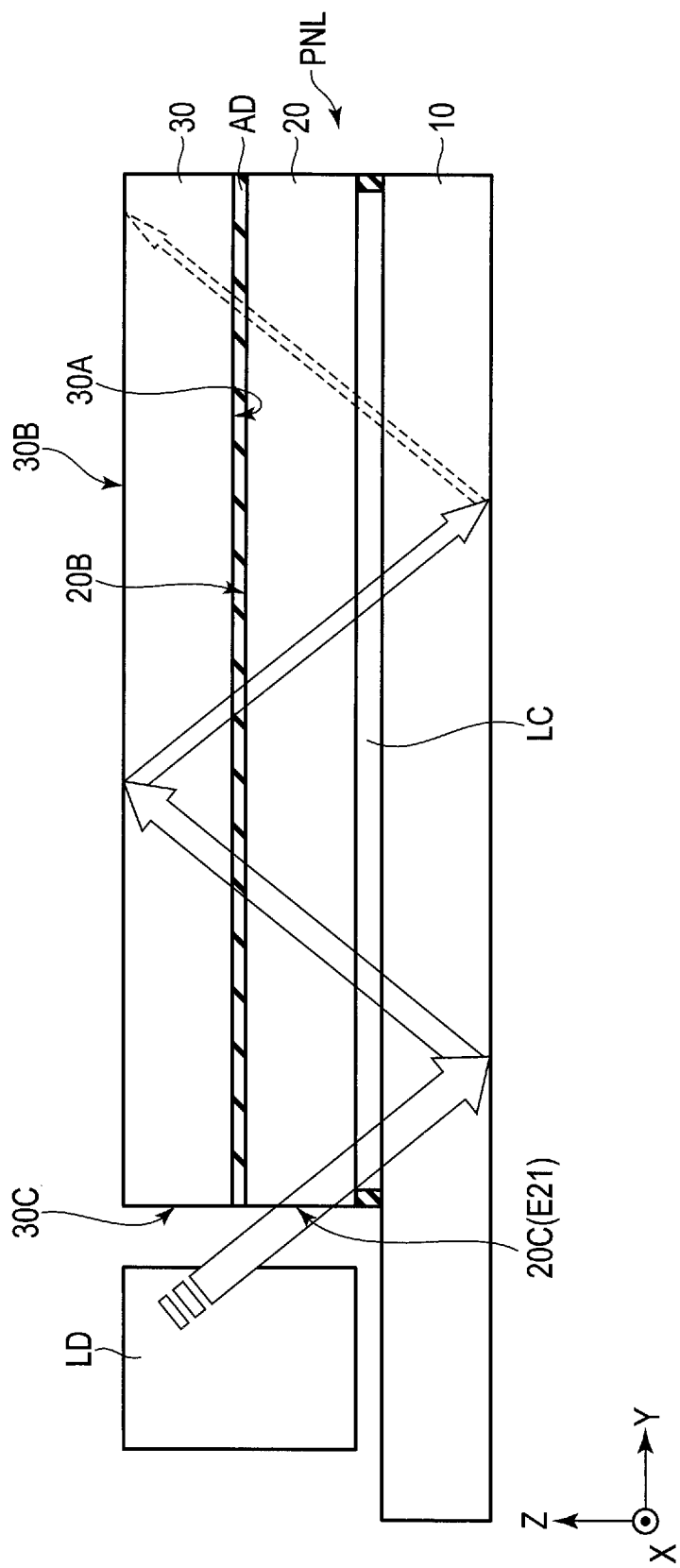
F I G. 17

DISPLAY DEVICE INCLUDING A LIQUID CRYSTAL LAYER INCLUDING STREAKY POLYMERS AND LIQUID CRYSTAL MOLECULES

CROSS-REFERENCE TO RELATED APPLICATIONS

This application is based upon and claims the benefit of priority from Japanese Patent Application No. 2018-219297, filed Nov. 22, 2018, the entire contents of which are incorporated herein by reference.

FIELD

Embodiments described herein relate generally to a display device.

BACKGROUND

Recently, display devices using polymer dispersed liquid crystal capable of switching between a scattering state of scattering incident light and a transmitting state of transmitting incident light have been proposed. For example, a display device in which a reflective layer formed of aluminum, silver or the like covers a pixel switch circuit has been disclosed.

BRIEF DESCRIPTION OF THE DRAWINGS

FIG. 15 is an illustration for explaining a measurement method for measuring the absorptance of a sample.

FIG. 16 is an illustration showing results of absorptance measurement of materials used for forming the display panel PNL.

FIG. 17 is an illustration for explaining how light emitted from a light-emitting element LS propagates through the display device DSP.

DETAILED DESCRIPTION

Figure 1:
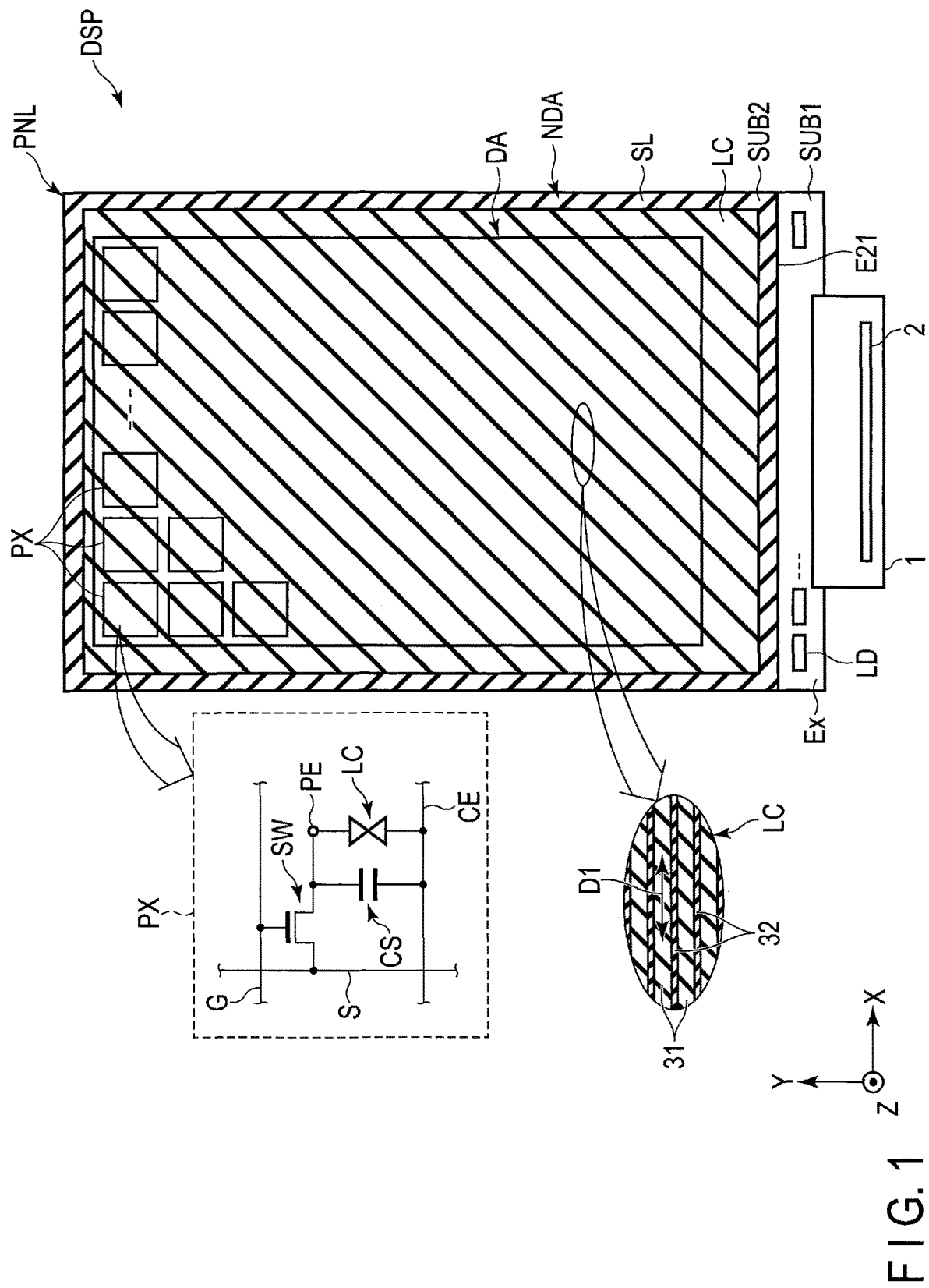
FIG. 1 is a plan view showing an example of a display device DSP of the present embodiment.

In general, according to one embodiment, a display device includes a first substrate, a second substrate, a liquid crystal layer located between the first substrate and the second substrate and including polymers and liquid crystal molecules, and a light-emitting element. The first substrate includes a transparent substrate, a scanning line, a signal line crossing the scanning line, a switching element electrically connected to the scanning line and the signal line, an organic insulating film overlapping the switching element, and a pixel electrode electrically connected to the switching element, and a thickness of the organic insulating film located between the transparent substrate and the pixel electrode is less than a thickness of the organic insulating film overlapping the switching element.

According to another embodiment, a display device includes a first substrate, a second substrate, a liquid crystal layer located between the first substrate and the second substrate and including polymers and liquid crystal molecules, and a light-emitting element. The first substrate includes a transparent substrate, a scanning line, a signal line crossing the scanning line, a switching element electrically connected to the scanning line and the signal line, an organic insulating film overlapping the switching element, and a pixel electrode electrically connected to the switching element, and the organic insulating film is not between the transparent substrate and the pixel electrode.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented, but such schematic illustration is merely exemplary, and in no way restricts the interpretation of the invention. Furthermore, in the specification and drawings, structural elements which function in the same manner as or a similar manner to those described in connection with preceding drawings are denoted by the same reference numbers, and overlapping detailed descriptions thereof may be appropriately omitted.

First Configuration Example

FIG. 1 is a plan view showing an example of a display device DSP of the present embodiment. A first direction X, a second direction Y and a third direction Z are, for example, orthogonal to each other but may cross one another at an angle other than 90°. The first direction X and the second direction Y correspond to directions parallel to the surfaces of substrates constituting the display device DSP, and the third direction Z corresponds to the thickness direction of the display device DSP. In the present specification, a direction from a first substrate SUB1 toward a second substrate SUB2 will be referred to as the upper side (or simply above) and a direction from the second substrate SUB2 toward the first substrate SUB1 will be referred to as the lower side (or simply below). In cases of "the second member above the first member" and "the second member below the first member", the second member may be in contact with the first member or may be spaced apart from the first member. In addition, an observation position in which the display device DSP is observed is assumed to be located on the pointing end side of an arrow indicating the third direction Z, and a view from this observation position toward an X-Y plane defined by the first direction X and the second direction Y will be referred to as a planar view.

In the present embodiment, a liquid crystal display device employing polymer dispersed liquid crystal will be described as an example of the display device DSP. The display device DSP includes a display panel PNL, a wiring substrate 1, an IC chip 2 and light-emitting elements LD.

The display panel PNL includes a first substrate SUB1, a second substrate SUB2, a liquid crystal layer LC and a sealant SL. Each of the first substrate SUB1 and the second substrate SUB2 is in the form of a flat plate parallel to the X-Y plane. The first substrate SUB1 and the second substrate SUB2 overlap each other in a planar view. The first substrate SUB1 and the second substrate SUB2 are bonded together by the sealant SL. The liquid crystal layer LC is held between the first substrate SUB1 and the second substrate SUB2 and is sealed in with the sealant SL. In FIG. 1, the liquid crystal layer LC and the sealant SL are indicated by different diagonal lines.

As shown in an enlarged schematic view in FIG. 1, the liquid crystal layer LC includes polymer dispersed liquid crystal including polymers 31 and liquid crystal molecules 32. For example, the polymers 31 are liquid crystal polymers. The polymers 31 are in the form of streaks extending in one direction. For example, an extension direction D1 of the polymers 31 is a direction parallel to the first direction X. The liquid crystal molecules 32 are dispersed in the gaps between the polymers 31, and are aligned such that major axes thereof align in the first direction X. Each of the polymer 31 and the liquid crystal molecule 32 has optical anisotropy or refractive anisotropy. The responsiveness of the polymer 31 to an electric field is lower than the responsiveness of the liquid crystal molecule 32 to an electric field.

For example, the alignment direction of the polymer 31 hardly changes regardless of the presence or absence of an electric field. On the other hand, the alignment direction of the liquid crystal molecule 32 changes in accordance with an electric field in a state where voltage higher than a threshold value is applied to the liquid crystal layer LC. In a state where voltage is not applied to the liquid crystal layer LC, the optical axis of the polymer 31 and the optical axis of the liquid crystal molecule 32 are parallel to each other, and light which has entered the liquid crystal layer LC is transmitted through the liquid crystal layer LC and hardly scattered in the liquid crystal layer LC (transparent state). In a state where voltage is applied to the liquid crystal layer LC, the optical axis of the polymer 31 and the optical axis of the liquid crystal molecule 32 cross each other, and light which has entered the liquid crystal layer LC is scattered in the liquid crystal layer LC (scattering state).

The display panel PNL includes a display portion DA in which an image is displayed and a frame-shaped non-display portion NDA which surrounds the display portion DA. The sealant SL is located in the non-display portion NDA. The display portion DA includes pixels PX arrayed in a matrix in the first direction X and the second direction Y.

As shown in an enlarged view in FIG. 1, each pixel PX includes a switching element SW, a pixel electrode PE, a common electrode CE, a liquid crystal layer LC and the like. The switching element SW is formed of, for example, a thin-film transistor (TFT) and is electrically connected to a scanning line G and a signal line S. The scanning line G is electrically connected to the switching elements SW provided respectively in the pixels PX arranged in the first direction X. The signal line S is electrically connected to the switching elements SW provided respectively in the pixels PX arranged in the second direction Y. The pixel electrode PE is electrically connected to the switching element SW. Each pixel electrode PE faces the common electrode CE in the third direction Z, and drives the liquid crystal layer LC (more specifically, the liquid crystal molecules 32) by an electric field produced between the pixel electrode PE and the common electrode CE. Capacitance CS is formed between, for example, an electrode having the same potential as that of the common electrode CE and an electrode having the same potential as that of the pixel electrode PE.

The wiring substrate 1 is electrically connected to an extension portion Ex of the first substrate SUB1. The wiring substrate 1 is a bendable flexible printed circuit. The IC chip 2 is electrically connected to the wiring substrate 1. For example, a display driver which outputs a signal necessary for image display or the like is incorporated in the IC chip 2. Note that the IC chip 2 may be electrically connected to the extension portion Ex. Each of the wiring substrate 1 and the IC chip 2 may read a signal from the display panel PNL but mainly functions as a signal source which supplies a signal to the display panel PNL.

The light-emitting elements LD overlap the extension portion Ex. The light-emitting elements LD are arranged and spaced apart from one another in the first direction X. These light-emitting elements LD are arranged along an end portion E21 of the second substrate SUB2 and emit light toward the end portion E21.

Figure 2:
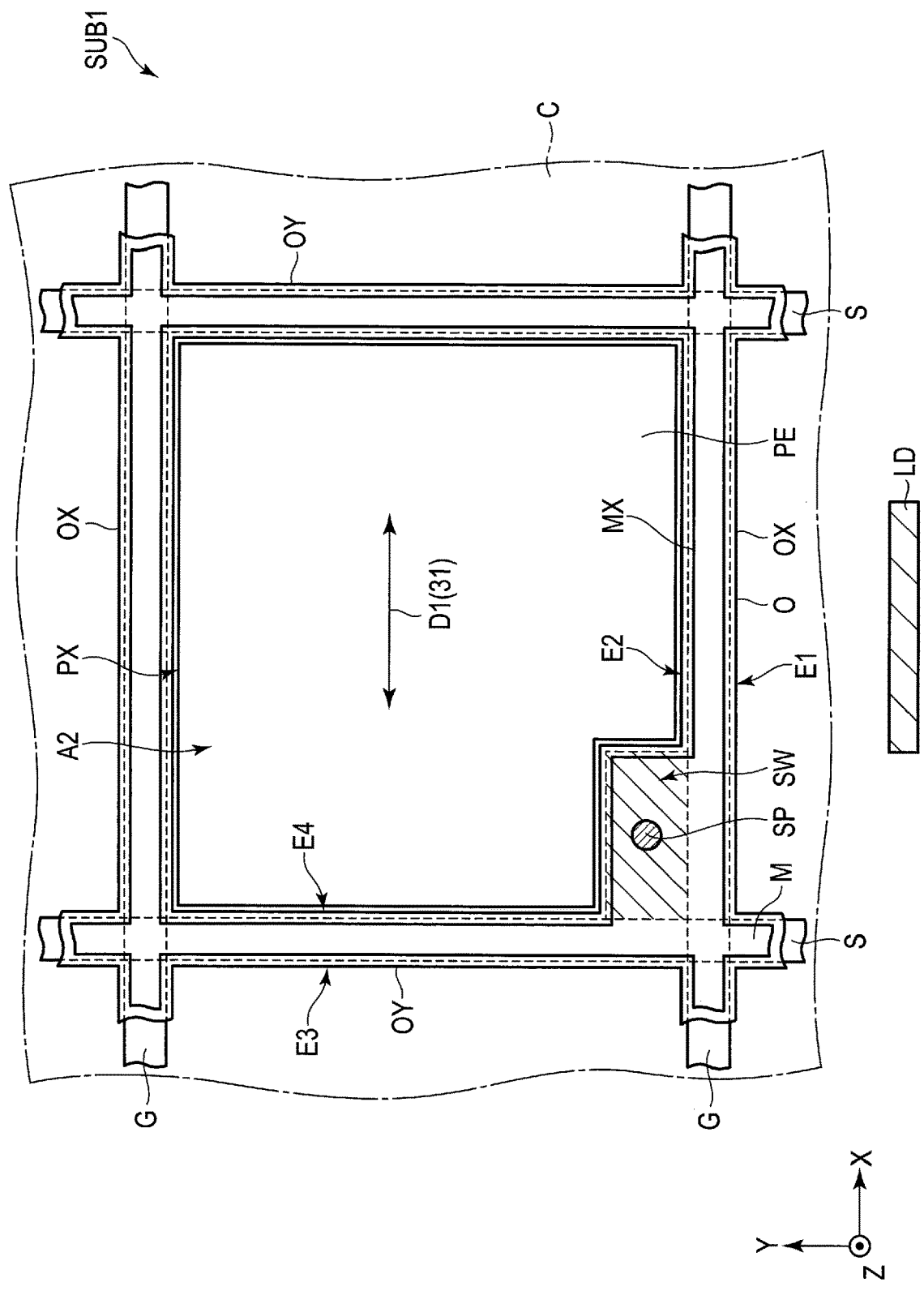
FIG. 2 is a plan view showing the first configuration example of a pixel PX in a first substrate SUB1.

FIG. 2 is a plan view showing the first configuration example of the pixel PX in the first substrate SUB1. The first substrate SUB1 includes scanning lines G, signal lines G, a switching element SW, an organic insulating film O, metal lines M, a capacitance electrode C and a pixel electrode PE.

Two scanning lines G extend in the first direction X, and are arranged and spaced apart from each other in the second direction Y. Two signal lines S extend in the second direction Y, and are arranged and spaced apart from each other in the first direction X. The pixel PX corresponds to a region delimited by two signal lines S and two scanning lines G.

The switching element SW is arranged in an intersection portion in which the scanning line G and the signal line S intersect. Although the specific configuration of the switching element SW will be described later, the switching element SW may be a bottom-gate type switching element in which a gate electrode is located below a semiconductor layer or may be a top-gate type switching element in which a gate electrode is located above a semiconductor layer. The semiconductor layer is formed of, for example, amorphous silicon but may be formed of polycrystalline silicon or an oxide semiconductor.

The organic insulating film O is patterned, and in the first configuration example shown in FIG. 2, the organic insulating film O is in the form of a grid in a planar view. That is, the organic insulating film O overlaps the scanning lines G, the signal lines S and the switching element SW. The organic insulating film O includes first portions OX overlapping the scanning lines G and second portions OY overlapping the signal lines S. The first portion OX has a first side surface E1 located close to the light-emitting elements LD, and a second side surface E2 located on the opposite side from the first side surface E1. The first side surface E1 and the second side surface E2 extend in the extension direction D1 of the polymers 31. The second portion OY has a third side surface E3 and a fourth side surface E4 located on the opposite side from the third side surface E3.

In the present specification, a region in which the organic insulating film O is arranged will be referred to as a first region A1 of the first substrate SUB1, and a region in which the organic insulating film O is not arranged will be referred to as a second region A2 of the first substrate SUB1. The second region A2 is surrounded with the first region A1 and is located on the inside of the first region A1.

The metal lines M are arranged in the first region A1, and in the first configuration example shown in FIG. 2, the metal lines M are in the form of a grid in a planar view. That is, the metal lines M overlap the scanning lines G, the signal lines S and the switching element SW. The metal lines M include first line portions MX overlapping the scanning lines G and the first portions OX, and second line portions MY overlapping the signal lines S and the second portions OY.

As indicated by a dot-dash line, the capacitance electrode C is arranged over the pixels PX and is arranged over almost the entire region of the first substrate SUB1. That is, the capacitance electrode C is arranged in both the first region A1 and the second region A2. The capacitance electrode C overlaps the switching element SW, the scanning lines G, the signal lines S and the organic insulating film O in the first region A1.

The pixel electrode PE overlaps the capacitance electrode C in the second region A2. In the example shown in FIG. 2, the pixel electrode PE is disposed on the inside of a region in which the organic insulating film O is arranged. Note that the pixel electrode PE may be disposed in such a manner as to overlap the first portions OX and the second portions OY.

In the example shown in FIG. 2, a spacer SP overlaps the switching element SW and forms a predetermined cell gap between the first substrate SUB1 and the second substrate SUB2.

Figure 3:
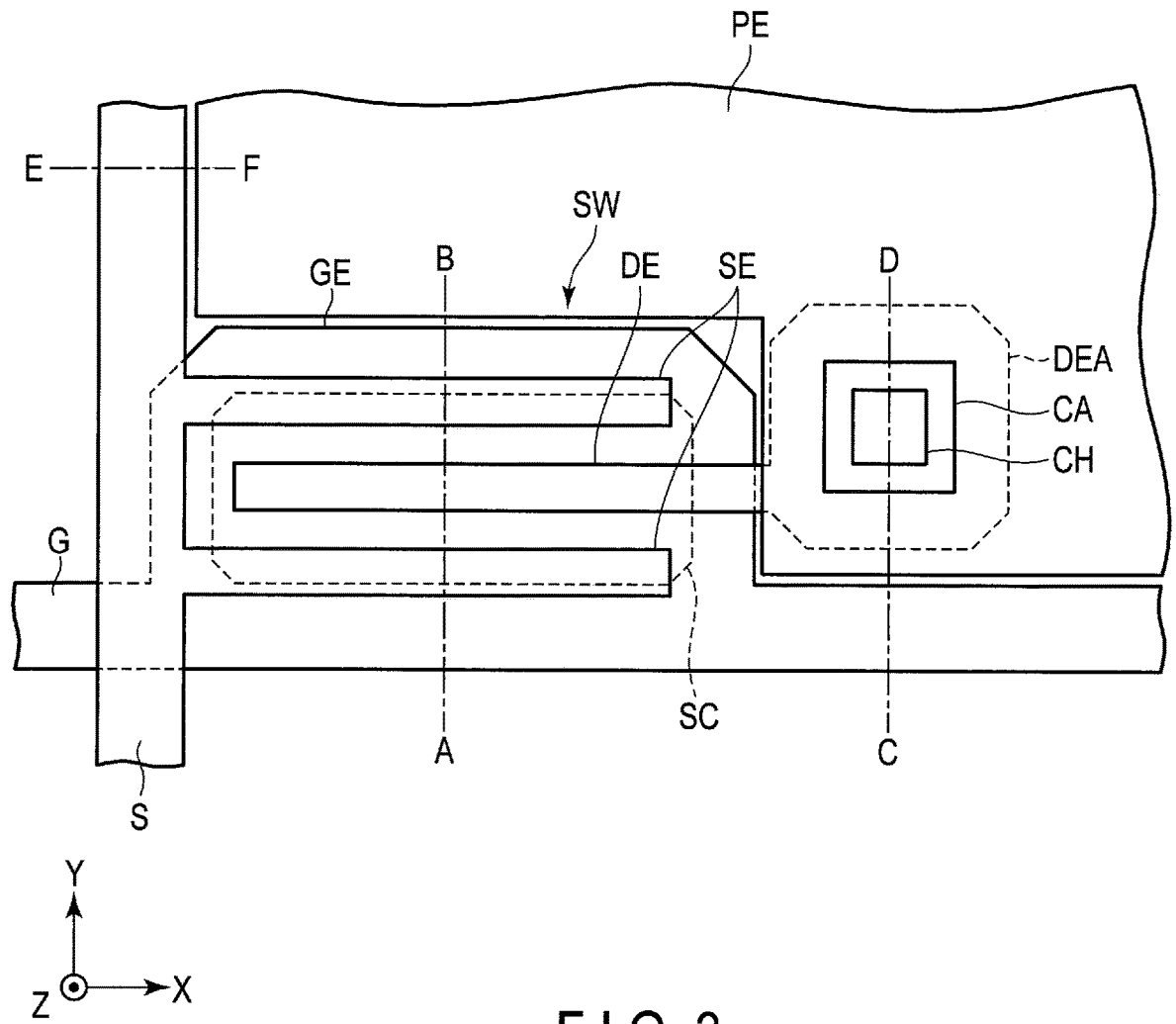
FIG. 3 is an enlarged plan view showing an example of a switching element SW shown in FIG. 2.

FIG. 3 is an enlarged plan view showing an example of the switching element SW shown in FIG. 2. The switching element SW includes a semiconductor layer SC, a gate electrode GE, source electrodes SE and a drain electrode DE. The gate electrode GE is integrally formed with the scanning line G. The semiconductor layer SC overlaps the gate electrode GE. Two source electrodes SE are integrally formed with the signal line S and are in contact with the semiconductor layer SC. The drain electrode DE is located between two source electrodes SE and is in contact with the semiconductor layer SC. The drain electrode DE includes a connection portion DEA. The connection portion DEA is electrically connected to the pixel electrode PE via an opening CA formed in the capacitance electrode C, and a contact hole CH.

Figure 4:
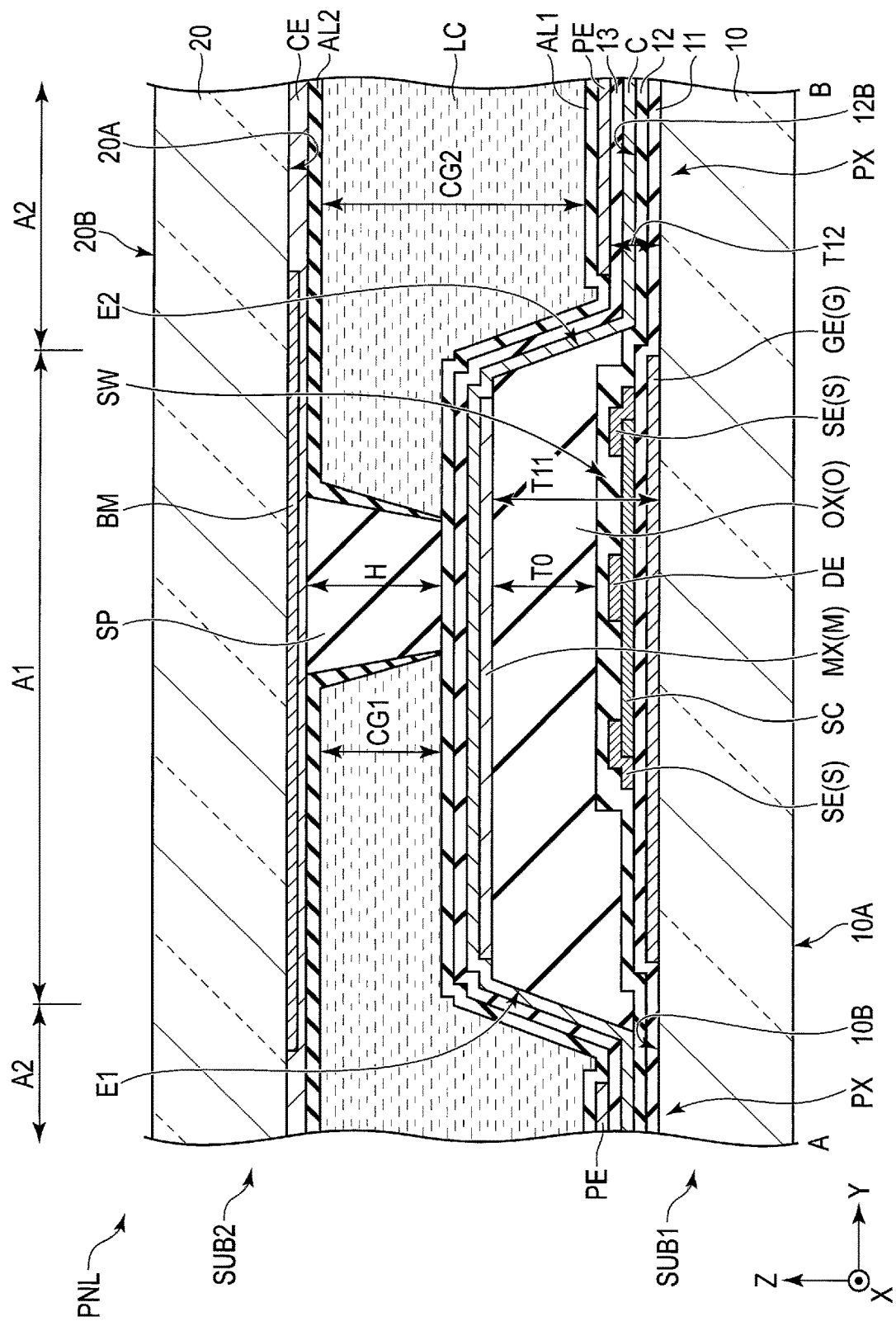
FIG. 4 is a cross-sectional view of a display panel PNL taken along line A-B including the switching element SW shown in FIG. 3.

FIG. 4 is a cross-sectional view of the display panel PNL taken along line A-B including the switching element SW shown in FIG. 3. The first substrate SUB1 further includes a transparent substrate 10, insulating films 11 to 13 and an alignment film AL1. The transparent substrate 10 includes a surface (lower surface) 10A and a surface (upper surface) 10B located on the opposite side from the surface 10A. The surfaces 10A and 10B are surfaces substantially parallel to the X-Y plane. The gate electrode GE, which is integrally formed with the scanning line G, is arranged on the surface 10B side. The insulating film 11 covers the gate electrode GE and the scanning line G and is in contact with the surface 10B. The semiconductor layer SC is located on the insulating film 11 directly above the gate electrode GE. Two source electrodes SE, which are integrally formed with the signal line S, are in contact with the semiconductor layer SC and are partially located on the insulating film 11. The drain electrode DE is in contact with the semiconductor layer SC. The insulating film 12 covers the semiconductor layer SC, the source electrodes SE and the drain electrode DE which constitute the switching element SW, and also covers the insulating film 11.

The first portion OX of the organic insulating film O is in contact with an upper surface 12B of the insulating film 12 directly above the gate electrode GE and the scanning line G or directly above the switching element SW. The first line portion MX of the metal line M is located on the first portion OX directly above the gate electrode GE and the scanning line G or directly above the switching element SW.

The capacitance electrode C covers the first line portion MX and the first portion OX in the first region A1. That is, the first side surface E1 and the second side surface E2 of the first portion OX are covered with the capacitance electrode C. The first line portion MX is in contact with the capacitance electrode C and is electrically connected to the capacitance electrode C. In addition, the capacitance electrode C is in contact with the upper surface 12B of the insulating film 12 in the second region A2.

The insulating film 13 is arranged in the first region A1 and the second region A2 and covers the capacitance electrode C. Each pixel electrode PE is located on the insulating film 13 in the second region A2. The pixel electrode PE and the capacitance electrode C face each other via the insulating film 13 and form storage capacitance necessary for image display in the pixel PX. The switching element SW is located between the pixel electrodes PE which are adjacent to each other in the second direction Y. Each of the first side surface E1 and the second side surface E2 is located between the switching element SW and the pixel electrode PE in the second direction Y. The alignment film AL1 covers the pixel electrode PE and the insulating film 13.

In the above-described first substrate SUB1, the thickness in the third direction Z of the organic insulating film O between the transparent substrate 10 and the pixel electrode PE is less than a thickness T0 in the third direction Z of the organic insulating film O overlapping the switching element SW. In the first configuration example shown in FIG. 4, the organic insulating film O is not between the transparent substrate 10 and the pixel electrode PE. That is, the thickness of the organic insulating film O between the transparent substrate 10 and the pixel electrode PE is zero.

In addition, a thickness T11 in the third direction Z of the organic insulating film O between the transparent substrate 10 and the metal line M is greater than a thickness T12 in the third direction Z between the transparent substrate 10 and the pixel electrode PE. In other words, the pixel electrode PE is located below the level in the third direction Z of the metal line M. That is, the pixel electrode PE is closer to the transparent substrate 10 than the metal line M.

The second substrate SUB2 includes a transparent substrate 20, a light-shielding layer BM, the common electrode CE, the spacer SP and an alignment film AL2. The transparent substrate 20 has a surface (lower surface) 20A and a surface (upper surface) 20B located on the opposite side from the surface 20A. The surfaces 20A and 20B are surfaces substantially parallel to the X-Y plane. The surface 20A faces the surface 10B. The light-shielding layer BM and the common electrode CE are arranged on the surface 20A. The light-shielding layer BM is located directly above the first side surface E1 and the second side surface E2 of the first portion OX, directly above the switching element SW, and directly above the gate electrode GE. The common electrode CE is arranged over the pixels PX and covers the light-shielding layer BM. The common electrode CE is electrically connected to the capacitance electrode C and has the same potential as that of the capacitance electrode C. The spacer SP is formed below the common electrode CE and is in contact with the alignment film AL1. The spacer SP is located between the organic insulating film O and the light-shielding layer BM. The alignment film AL2 covers the common electrode CE.

The liquid crystal layer LC is located between the first substrate SUB1 and the second substrate SUB2 and is in contact with the alignment films AL1 and AL2. The liquid crystal layer LC has cell gaps CG1 and CG2. The cell gap CG1 corresponds to a length in the third direction Z from the alignment film AL1 to the alignment film AL2 in the first region A1. The cell gap CG2 corresponds to a length in the third direction Z from the alignment film AL1 to the alignment film AL2 in the second region A2. The cell gap CG1 is less than the cell gap CG2. The cell gap CG1 is, for example, about 1.5 µm. The cell gap CG2 is, for example, about 3.0 µm.

By adjusting the balance between a height H in the third direction Z of the spacer SP and the thickness T0 of the organic insulating film O, it becomes possible to obtain desirable effects while maintain the cell gap CG2. For example, if the thickness T0 of the organic insulating film O is reduced and the height H of the spacer SP is increased as compared to the example shown in FIG. 4, the cell gap CG1 will be expanded. As a result, in the process of manufacturing the liquid crystal layer LC, a liquid crystal material can be spread more easily. In addition, if the height H of the spacer SP is reduced and the thickness T0 of the organic insulating film O is increased as compared to the example shown in FIG. 4, the gap in the third direction Z between the switching element SW or scanning line G and the metal line M can be expanded. As a result, undesirable capacitance between the switching element SW or scanning line G and the metal line M can be reduced.

Each of the transparent substrates 10 and 20 is an insulating substrate such as a glass substrate or a plastic substrate. Each of the insulating films 11 to 13 is formed of, for example, a transparent inorganic insulating material such as silicon nitride or silicon oxide. The organic insulating film O is formed of, for example, a transparent organic insulating material such as acrylic resin. Each of the scanning line G, the signal line S and the metal line M is, for example, a layered product of a plurality of conductive layers which are stacked one on top of another and is, for example, a layered product of a conductive layer containing molybdenum (Mo), a conductive layer containing aluminum (Al) and a conductive layer containing molybdenum (Mo) which are stacked in this order. However, each of the scanning line G, the signal line S and the metal line M is not limited to this example and may be a layered product of a conductive layer containing titanium (Ti), a conductive layer containing aluminum (Al) and a conductive layer containing titanium (Ti) which are stacked in this order. Note that the scanning line G may be a layered product of a conductive layer containing molybdenum (Mo) and a conductive layer containing aluminum (Al) and that the conductive layer containing aluminum (Al) should preferably be in contact with the surface 10B. Since the light reflectance of aluminum (Al) is higher than that of molybdenum (Mo), as compared to a case where the conductive layer containing molybdenum (Mo) of the scanning line G is in contact with the surface 10B, absorption of light propagating through the transparent substrate 10 in the scanning line G can be suppressed. Each of the capacitance electrode C, the pixel electrode PE and the common electrode CE is a transparent electrode formed of a transparent conductive material such as indium tin oxide (ITO) or indium zinc oxide (IZO). The light-shielding layer BM is, for example, a conductive layer having resistance lower than that of the common electrode CE. For example, the light-shielding layer BM is formed of a non-transparent metal material such as molybdenum, aluminum, tungsten, titanium or silver. Since the common electrode CE is in contact with the light-shielding layer BM, the common electrode CE is electrically connected to the light-shielding layer BM. Consequently, the resistance of the common electrode CE is reduced. Each of the alignment films AL1 and AL2 is a horizontal alignment film having an alignment regulation force substantially parallel to the X-Y plane. For example, each of the alignment films AL1 and AL2 is subjected to alignment treatment in the first direction X. Note that the alignment treatment may be rubbing treatment or may be photo-alignment treatment.

Figure 5:
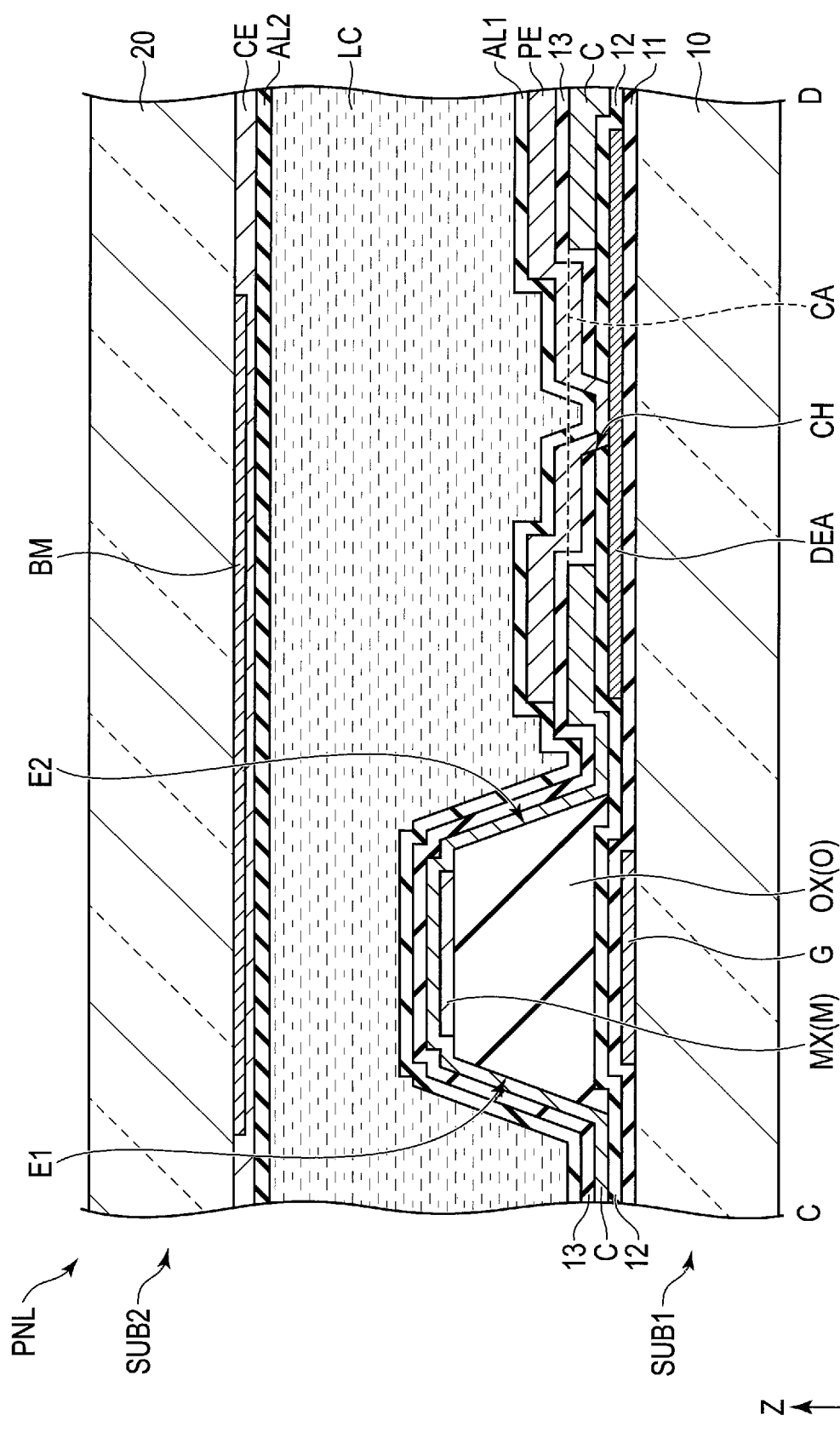
FIG. 5 is a cross-sectional view of the display panel PNL taken along line C-D including a scanning line G and a connection portion DEA shown in FIG. 3.

FIG. 5 is a cross-sectional view of the display panel PNL taken along line C-D including the scanning line G and the connection portion DEA shown in FIG. 3.

In the first substrate SUB1, the connection portion DEA is located on the insulating film 11 and is covered with the insulating film 12. The pixel electrode PE is in contact with the connection portion DEA via the contact hole CH penetrating the insulating film 12 and the insulating film 13, and the opening CA of the capacitance electrode C. The first line portion MX of the metal line M is located directly above the scanning line G. The first portion OX of the organic insulating film O is located between the scanning line G and the first line portion MX.

In the second substrate SUB2, the light-shielding layer BM is located directly above the first side surface E1 of the first portion OX, directly above the scanning line G, directly above the second side surface E2 of the first portion OX (between the scanning line G and the connection portion DEA), and directly above the connection portion DEA.

Figure 6:
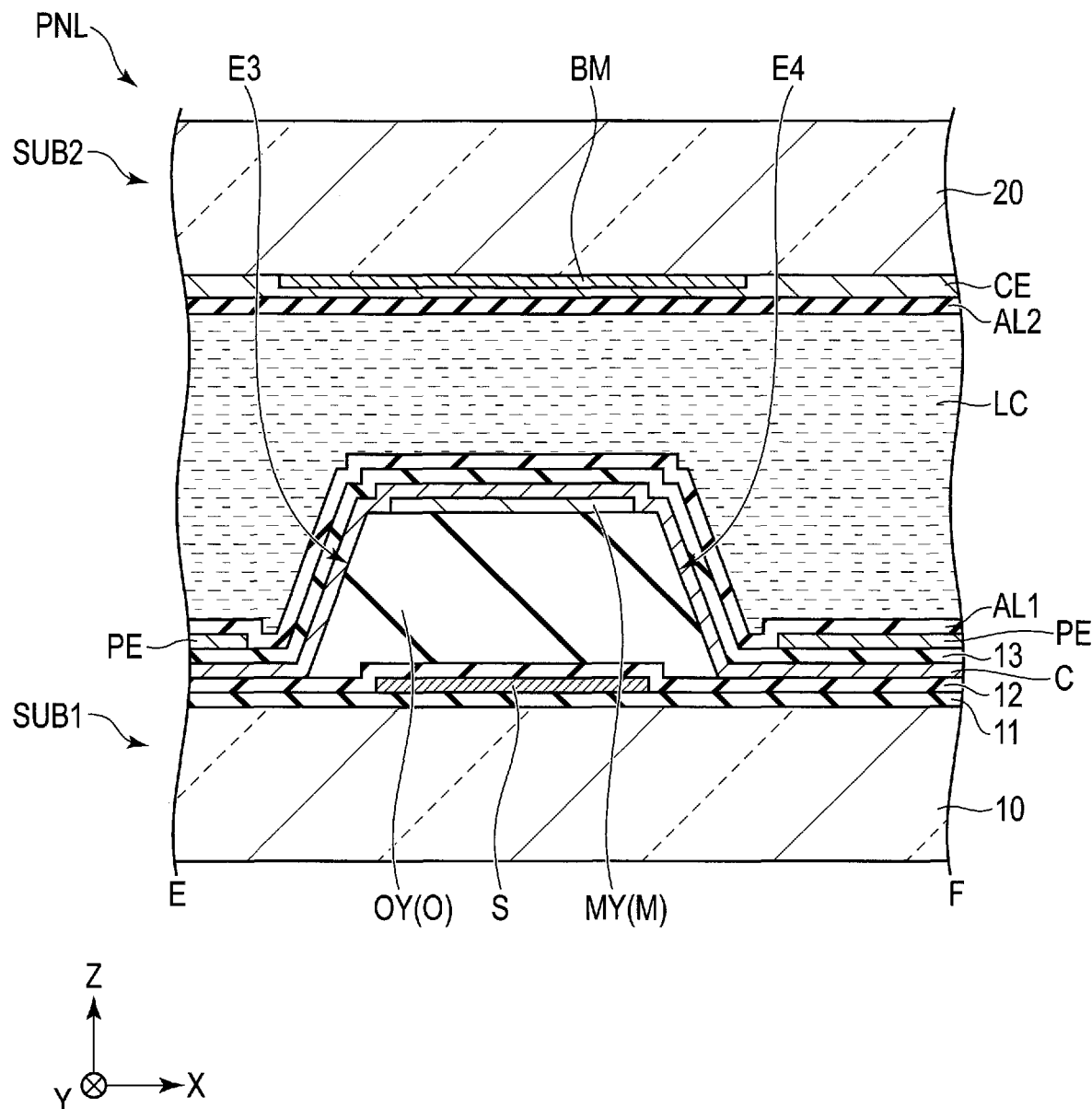
FIG. 6 is a cross-sectional view of the display panel PNL taken along line E-F including a signal line S shown in FIG. 3.

FIG. 6 is a cross-sectional view showing the display panel PNL taken along line E-F including the signal line S shown in FIG. 3.

In the first substrate SUB1, the signal line S is located on the insulating film 11 and is covered with the insulating film 12. Note that another conductive layer (light-shielding layer or reflective layer) formed of the same material as that of the scanning line G may be located between the insulating film 11 and the transparent substrate 10. The signal line S is located between the pixel electrodes PE which are adjacent to each other in the first direction X. The second portion OY of the organic insulating film O is located directly above the signal line S and is located between the pixel electrodes PE which are adjacent to each other in the first direction X. The third side surface E3 and the fourth side surface E4 of the second portion OY are covered with the capacitance electrode C. Each of the third side surface E3 and the fourth side surface E4 is located between the signal line S and the pixel electrode PE in the first direction X. The second line portion MY of the metal line M is located directly above the signal line S. In addition, the second line portion MY is in contact with the capacitance electrode C and is electrically connected to the capacitance electrode C. The second portion OY is located between the signal line S and the second line portion MY.

In the second substrate SUB2, the light-shielding layer BM is located directly above the third side surface E3 and the fourth side surface E4 of the second portion OY and directly above the signal line S.

Figure 7:
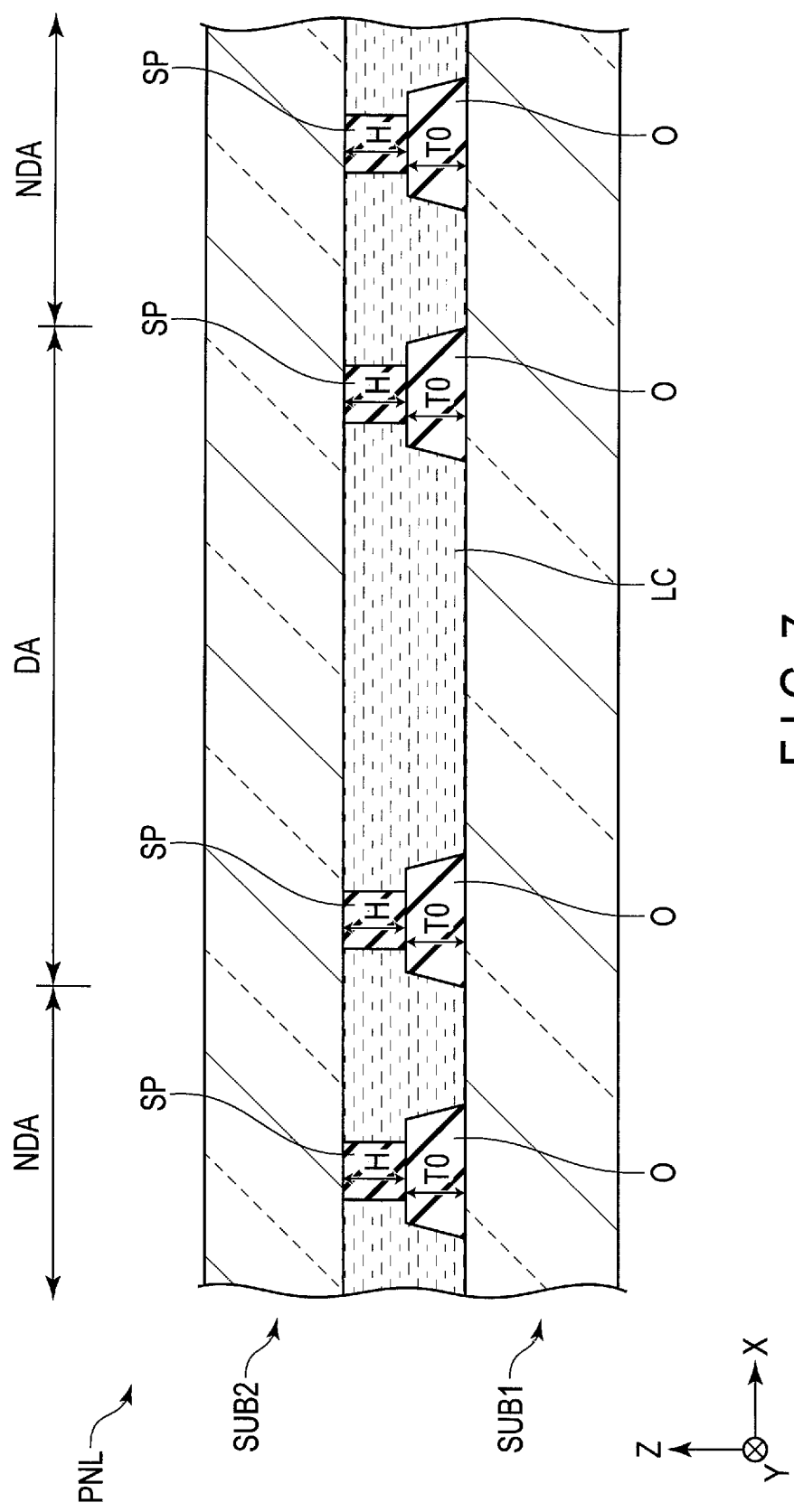
FIG. 7 is a schematic view of the display panel PNL of the present embodiment.

FIG. 7 is a schematic view showing the display panel PNL of the present embodiment. The following description will focus on the spacer SP and the organic insulating film O. The organic insulating film O is formed in both the above-described display portion DA and the non-display portion NDA. In the non-display portion NDA, the organic insulating film O has substantially the same thickness T0 as that of the organic insulating film O in the display portion DA. From the perspective of volume reduction of the organic insulating film O, the organic insulating film O should not be formed over the entire non-display portion NDA but should be patterned in such a manner as to overlap the spacers SP in the non-display portion NDA. That is, the spacers SP overlap the organic insulating film O in the display portion DA and the non-display portion NDA. In a case where the organic insulating film O is not formed over the entire non-display portion NDA, in order to make the cell gap uniform, it is necessary to form spacers having a height greater than that of the spacers SP in the display portion DA, in the non-display portion NDA. In the present embodiment, since the organic insulating film O has the thickness T0 in the display portion DA and the non-display portion NDA, it is possible to make the cell gap uniform by providing the spacers SP having substantially the same height H in the display portion DA and the non-display portion NDA. That is, it is not necessary to form spacers SP having different heights in the display portion DA and the non-display portion NDA, and it is possible to simplify the manufacturing process.

The display device DSP of the present embodiment operates in a mode where light emitted from the light-emitting element LD is entered from the end portion E21 of the second substrate SUB2 and is propagated through the display panel PNL, and the luminance tends to be reduced as the distance from the light-emitting element LD increases. One reason for the luminance reduction is considered to be absorption of light in the organic insulating film O. That is, the organic insulating film O absorbs part of the light propagating through the display panel PNL. Therefore, when the light propagates through the display panel PNL while repeating total reflection a plurality of times (100 times or more) within the display panel PNL, part of the light is absorbed in the organic insulating film O each time the light passes through the organic insulating film O, and consequently the luminance is degraded as the distance from the light-emitting element LD increases.

According to the present embodiment, the organic insulating film O overlaps the switching element SW but is not between the transparent substrate 10 and the pixel electrode PE. Alternatively, the thickness of the organic insulating film O formed between the transparent substrate 10 and the pixel electrode PE is extremely small. Therefore, as compared to a case where the organic insulating film O is formed between the transparent substrate 10 and the pixel electrode PE (or over the entire region of the display portion DA), the total volume of the organic insulating film O is small. As a result, the probability of the entry of the light propagating through the display panel PNL to the organic insulating film O is reduced, and the light absorption in the organic insulating film O can be suppressed. Consequently, display quality degradation can be suppressed.

In addition, the organic insulating film O overlaps the switching element SW, the scanning line G and the signal line S. The organic insulating film O is located between the switching element SW and the metal line M (or capacitance electrode C), between the scanning line G and the metal line M (or capacitance electrode C), and between the signal line S and the metal line M (or capacitance electrode C). As a result, undesirable capacitance between wiring lines which overlap each other can be reduced.

Furthermore, when the light from the light-emitting element LD enters the organic insulating film O, even if undesirable scattering of light occurs on the second side surface E2 of the organic insulating film O, scattered light will be blocked by the light-shielding layer BM arranged directly above the second side surface E2. Therefore, display quality degradation can be suppressed.

Furthermore, the third side surface E3 and the fourth side surface E4 of the organic insulating film O crosses the alignment treatment direction of the alignment films AL1 and AL2 (the first direction X). Even if alignment failure of the liquid crystal molecules 32 occurs on the third side surface E3 and the fourth side surface E4, undesirable light will be blocked by the light-shielding layer BM arranged directly above the third side surface E3 and the fourth side surface E4. Therefore, display quality degradation can be suppressed.

Note that alignment failure should preferably be reduced even if the light-shielding layer BM is formed. Therefore, in order to suppress alignment failure on the third side surface E3 and the fourth side surface E4, it is possible to perform back-and-forth rubbing, increase the intensity of rubbing, use a rubbing fabric having long fibers, or the like.

The light-shielding layer BM only needs to be arranged in such a manner as to block reflected light or scattered light on the side surfaces of the organic insulating film O. In addition, in a drive mode where the potential of the common electrode CE is changed, the light-shielding layer BM should preferably be formed of a conductive material. As a specific example of the light-shielding layer BM, a layered product of molybdenum, aluminum and molybdenum, a layered product of molybdenum and aluminum, a layered product of a copper compound and another metal, or the like can be applied. In a case where the light-shielding layer BM is a layered product of molybdenum and aluminum, a molybdenum layer is arranged on a side of the light-shielding layer BM which faces the liquid crystal layer LC, and an aluminum layer is arranged on a side of the light-shielding layer BM which faces the transparent substrate 20. Consequently, it is possible to suppress absorption of light propagating through the transparent substrate 20 and efficiently block reflected light or scattered light on the side surfaces of the organic insulating film O. On the other hand, in a drive mode where the potential of the common electrode CE is maintained as a constant potential, the light-shielding layer BM does not need to be formed of a conductive material but may be formed of a conductive material. In a case where the light-shielding layer BM is formed of a non-conductive material, the thickness should preferably be as small as possible for the purpose of preventing unnecessary scattering of light. Furthermore, in the light-shielding layer BM formed of a non-conductive material, it is preferable that a material having high reflectance should be arranged on a side of the light-shielding layer BM which faces the transparent substrate 20 and a material having low reflectance should be arranged on a side of the light-shielding layer BM which faces the organic insulating film O.

In the first configuration example, the transparent substrate 10 corresponds to the first transparent substrate, the transparent substrate 20 corresponds to the second transparent substrate, and the insulating film 12 corresponds to an inorganic insulating film.

Next, other configuration examples will be described with reference to FIGS. 8 to 14. Note that illustrations of the capacitance electrode C and the pixel electrode PE are omitted in FIGS. 8 to 14.

Second Configuration Example

Figure 8:
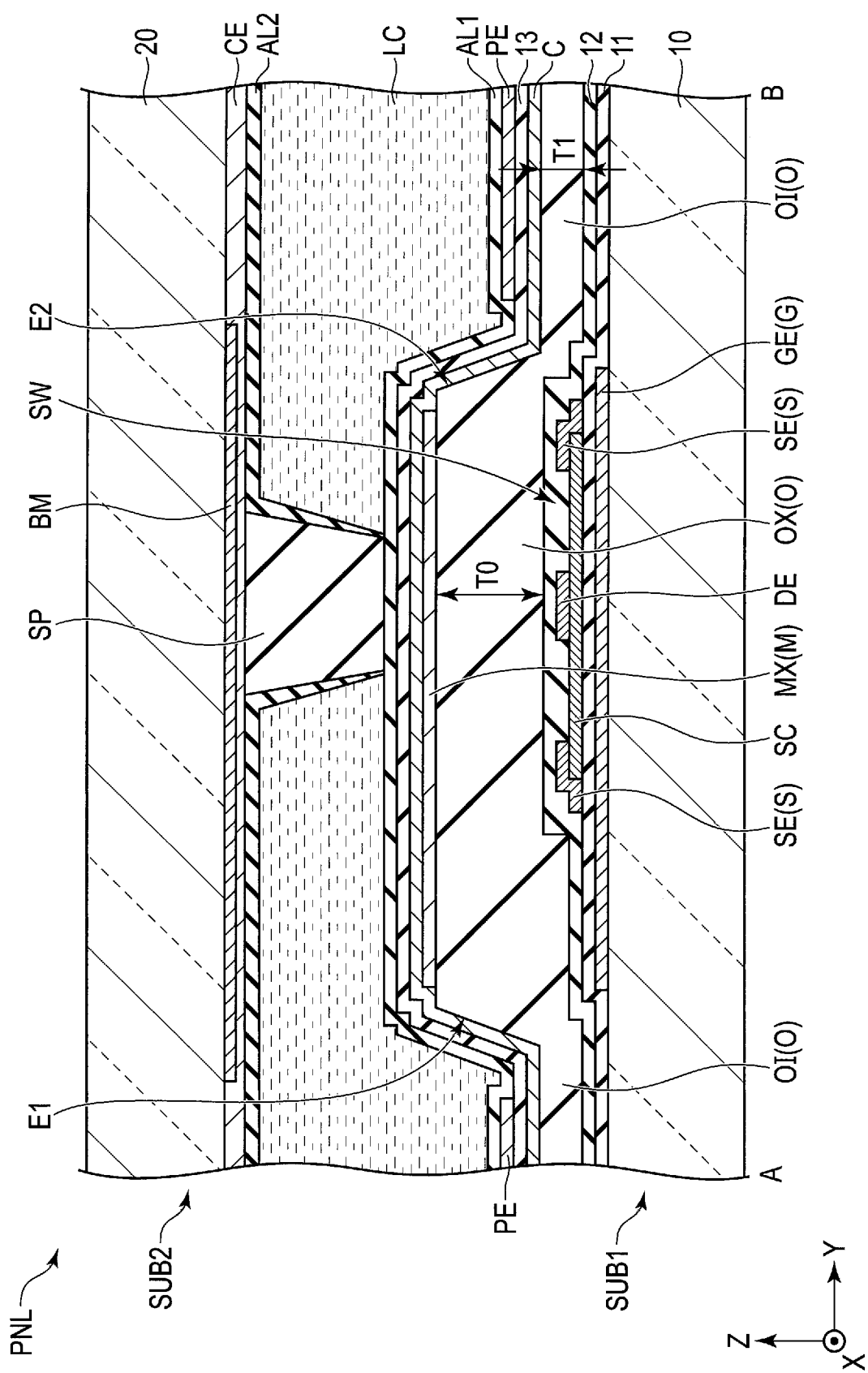
FIG. 8 is a plan view showing the second configuration example of the pixel PX in the first substrate SUB1.

FIG. 8 is a cross-sectional view showing the second configuration example of the display panel PNL. The second configuration example shown in FIG. 8 differs from the first configuration example shown in FIG. 4 in that the organic insulating film O includes a third portion OI between the transparent substrate 10 and the pixel electrode PE. More specifically, the third portion OI is located between the insulating film 12 and the capacitance electrode C and has a thickness T1 in the third direction Z. The capacitance electrode C is in contact with the organic insulating film O. The thickness T1 is less than the thickness T0. As described above, in the present embodiment, from the perspective of suppression of the light absorption in the organic insulating film O, the volume of the organic insulating film O should preferably be small, and also in the second configuration example where the organic insulating film O is interposed between the transparent substrate 10 and the pixel electrode PE, the thickness T1 should preferably be small. For example, the thickness T1 is less than or equal to ½ of the thickness T0.

Also in the second configuration example, the total volume of the organic insulating film O can be reduced, and therefore substantially the same effects as those of the first configuration example can be obtained.

Third Configuration Example

Figure 9:
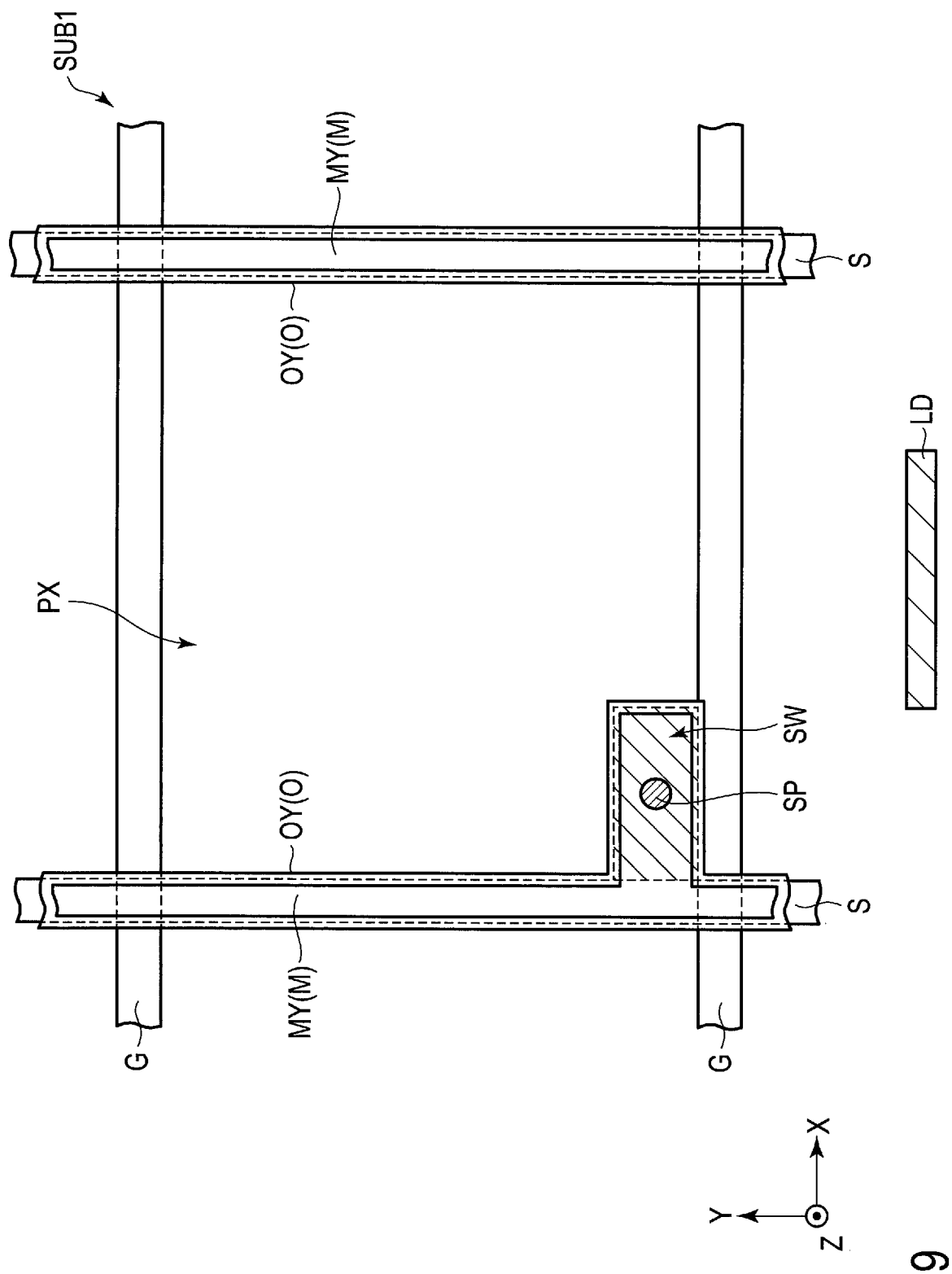
FIG. 9 is a plan view showing the third configuration example of the pixel PX in the first substrate SUB1.

FIG. 9 is a plan view showing the third configuration example of the pixel PX in the first substrate SUB1. The third configuration example shown in FIG. 9 differs from the first configuration example shown in FIG. 2 in that each of the organic insulating film O and the metal line M is in the form of a strip extending in the second direction Y. That is, the organic insulating film O includes the second portion OY which overlaps the switching element SW and also overlaps the signal line S. On the other hand, the organic insulating film O does not include the first portion OX. In addition, the metal line M includes the second line portion MY which overlaps the switching element SW via the organic insulating film O and also overlaps the signal line S. On the other hand, the metal line M includes the first line portion MX.

Also in the third configuration example, substantially the same effects as those of the above-described first configuration example can be obtained. In addition, since the first portion OX is omitted, the total volume of the organic insulating film O is further reduced, and the light absorption in the organic insulating film O can be further suppressed.

Furthermore, since the first portion OX is omitted, when the light from the light-emitting element LD enters the organic insulating film O, undesirable scattering of light on the second side surface E2 shown in FIG. 2 will be suppressed. Furthermore, the width in the first direction X of the light-shielding layer BM overlapping the scanning line G can be reduced, and the aperture area per pixel can be expanded.

Fourth Configuration Example

Figure 10:
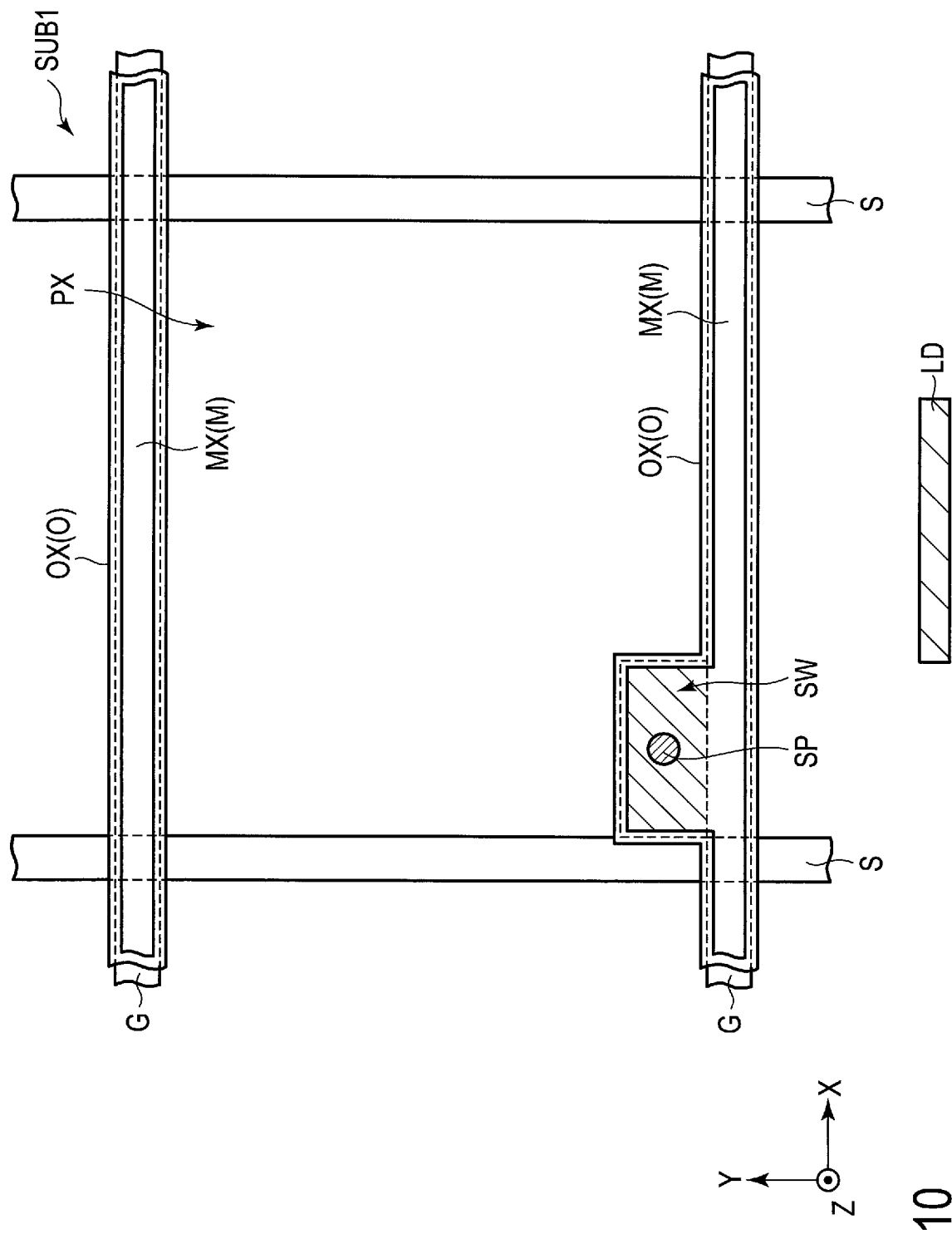
FIG. 10 is a plan view showing the fourth configuration example of the pixel PX in the first substrate SUB1.

FIG. 10 is a plan view showing the fourth configuration example of the pixel PX in the first substrate SUB1. The fourth configuration example shown in FIG. 10 differs from the first configuration example shown in FIG. 2 in that each of the organic insulating film O and the metal line M is in the form of a strip extending in the first direction X. That is, the organic insulating film O includes the first portion OX which overlaps the switching element SW and also overlaps the scanning line G. On the other hand, the organic insulating film O does not include the second portion OY. Furthermore, the metal line M includes the first line portion MX which overlaps the switching element SW via the organic insulating film O and also overlaps the scanning line G. On the other hand, the metal line M does not include the second line portion MY.

Also in the fourth configuration example, substantially the same effects as those of the above-described first configuration example can be obtained. In addition, since the second portion OY is omitted, the total volume of the organic insulating film O is further reduced, and the light absorption in the organic insulating film O is further suppressed.

Furthermore, since the second portion OY is omitted, alignment failure of the liquid crystal molecules 32 on the third side surface E3 and the fourth side surface E4 shown in FIG. 2 is suppressed. Furthermore, the width in the second direction Y of the light-shielding layer BM overlapping the signal line S can be reduced, and the aperture area per pixel can be expanded.

Next, the fifth configuration example and the sixth configuration example will be described with reference to FIG. 11 and FIG. 12, respectively. In the fifth configuration example and the sixth configuration example, the light-emitting elements LD are arranged and spaced apart from one another in the second direction Y, and the extension direction D1 of the polymers 31 is a direction parallel to the second direction Y.

Fifth Configuration Example

Figure 11:
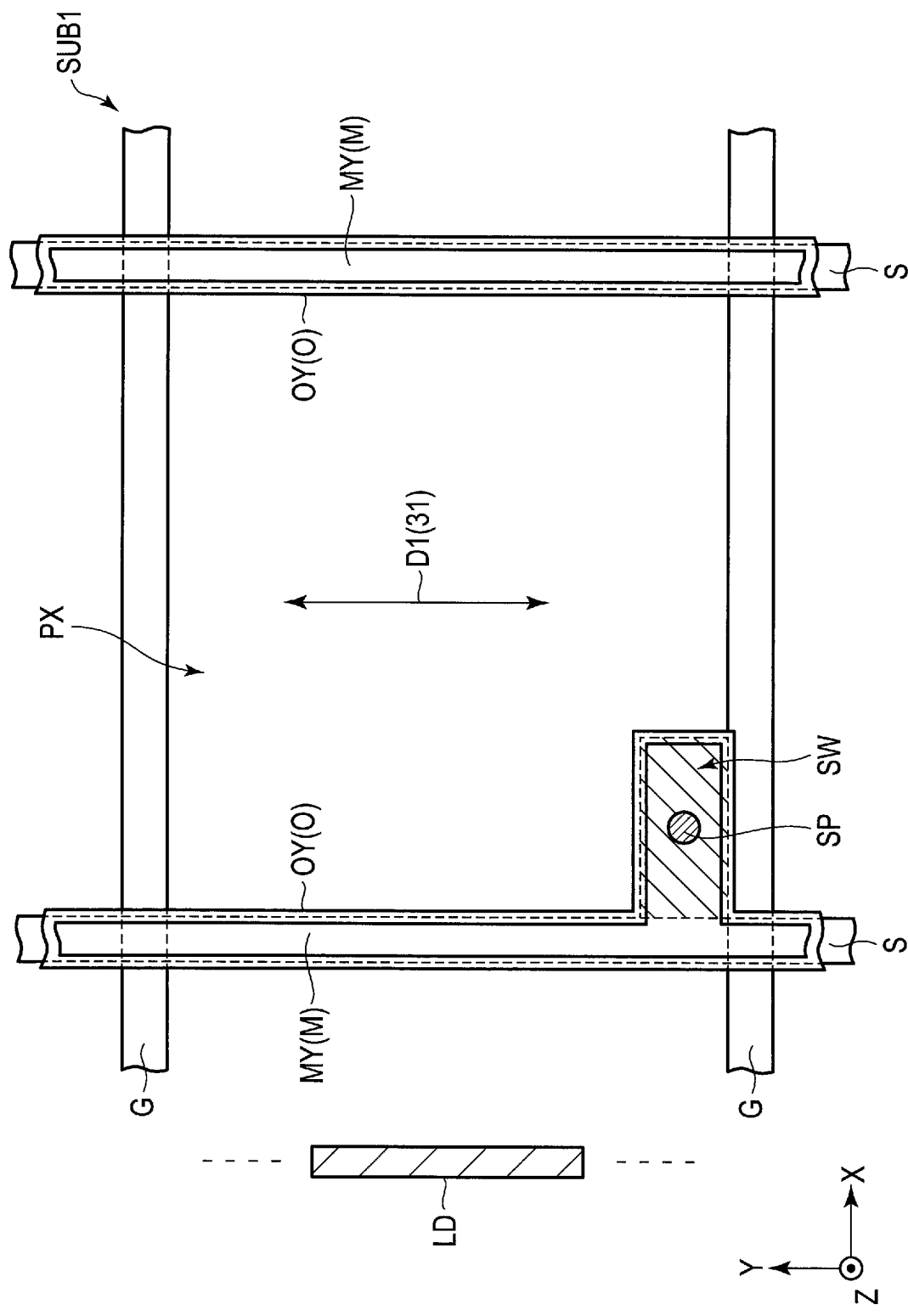
FIG. 11 is a plan view showing the fifth configuration example of the pixel PX in the first substrate SUB1.

FIG. 11 is a plan view showing the fifth configuration example of the pixel PX in the first substrate SUB1. The structure of the fifth configuration example shown in FIG. 11 is substantially the same as that of the third configuration example shown in FIG. 9 except for the above-described light-emitting elements LD and the above-described extension direction D1 of the polymers 31.

Also in the fifth configuration example, substantially the same effects as those of the above-described first configuration example can be obtained. In addition, since the first portion OX is omitted, the total volume of the organic insulating film O is further reduced, and the light absorption in the organic insulating film O can be further suppressed.

Furthermore, since the first portion OX is omitted, alignment failure of the liquid crystal molecules 32 on the first side surface E1 and the second side surface E2 shown in FIG. 2 is suppressed. Furthermore, the width in the first direction X of the light-shielding layer BM overlapping the scanning line G can be reduced, and the aperture area per pixel can be expanded.

Sixth Configuration Example

Figure 12:
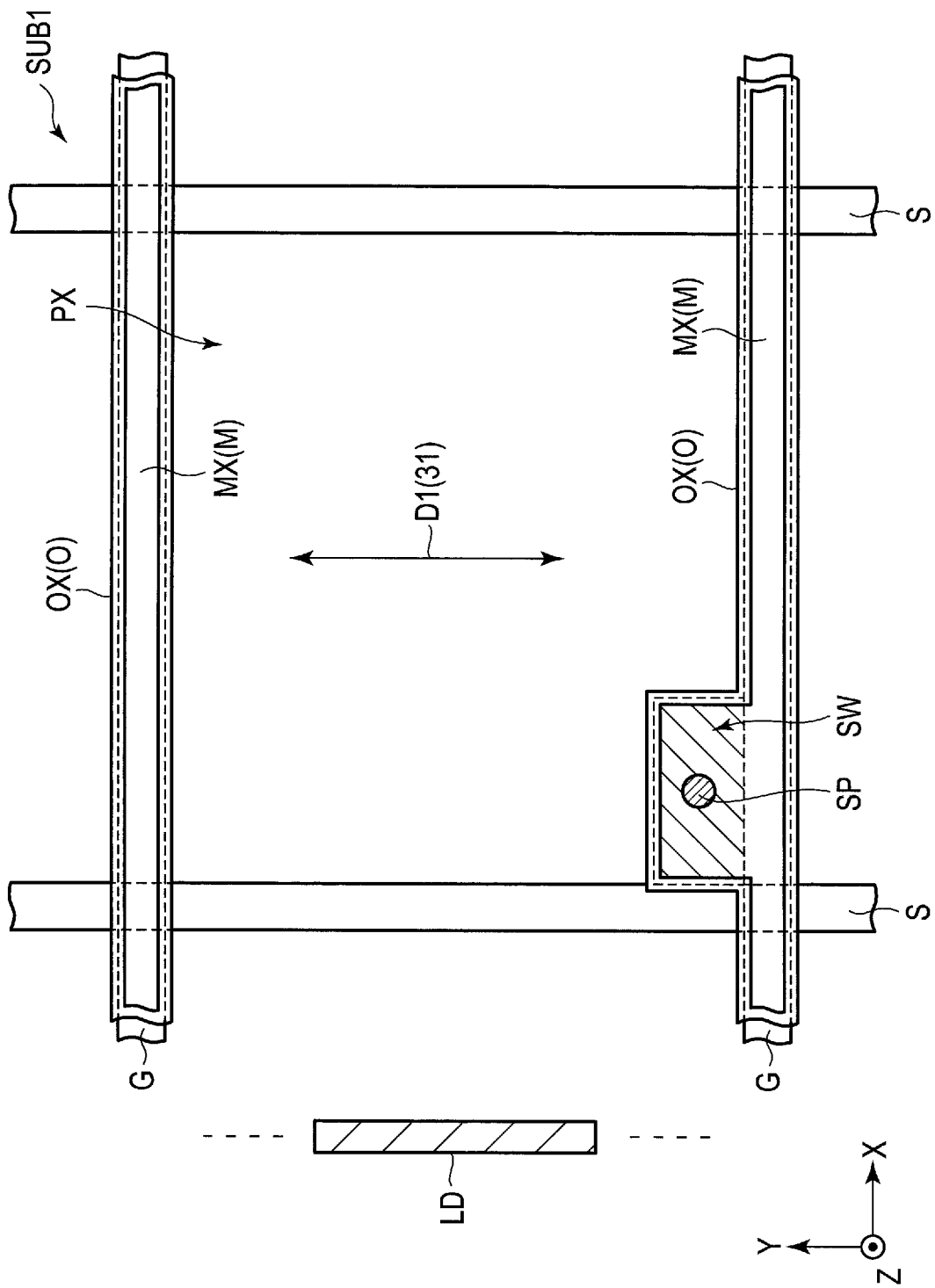
FIG. 12 is a plan view showing the sixth configuration example of the pixel PX in the first substrate SUB1.

FIG. 12 is a plan view showing the sixth configuration example of the pixel PX in the first substrate SUB1. The structure of the sixth configuration example shown in FIG. 12 is substantially the same as that of the fourth configuration example shown in FIG. 10 except for the above-described light-emitting elements LD and the above-described extension direction D1 of the polymers 31.

Also in the sixth configuration example, substantially the same effects as those of the above-described first configuration example can be obtained. In addition, since the second portion OY is omitted, the total volume of the organic insulating film O is further reduced, and the light absorption in the organic insulating film O is further suppressed.

Furthermore, since the first portion OX is omitted, when the light from the light-emitting element LD enters the organic insulating film O, undesirable scattering of light on the fourth side surface E4 shown in FIG. 2 is suppressed. Furthermore, the width in the second direction Y of the light-shielding layer BM overlapping the signal line S can be reduced, and the aperture area per pixel can be expanded.

Seventh Configuration Example

Figure 13:
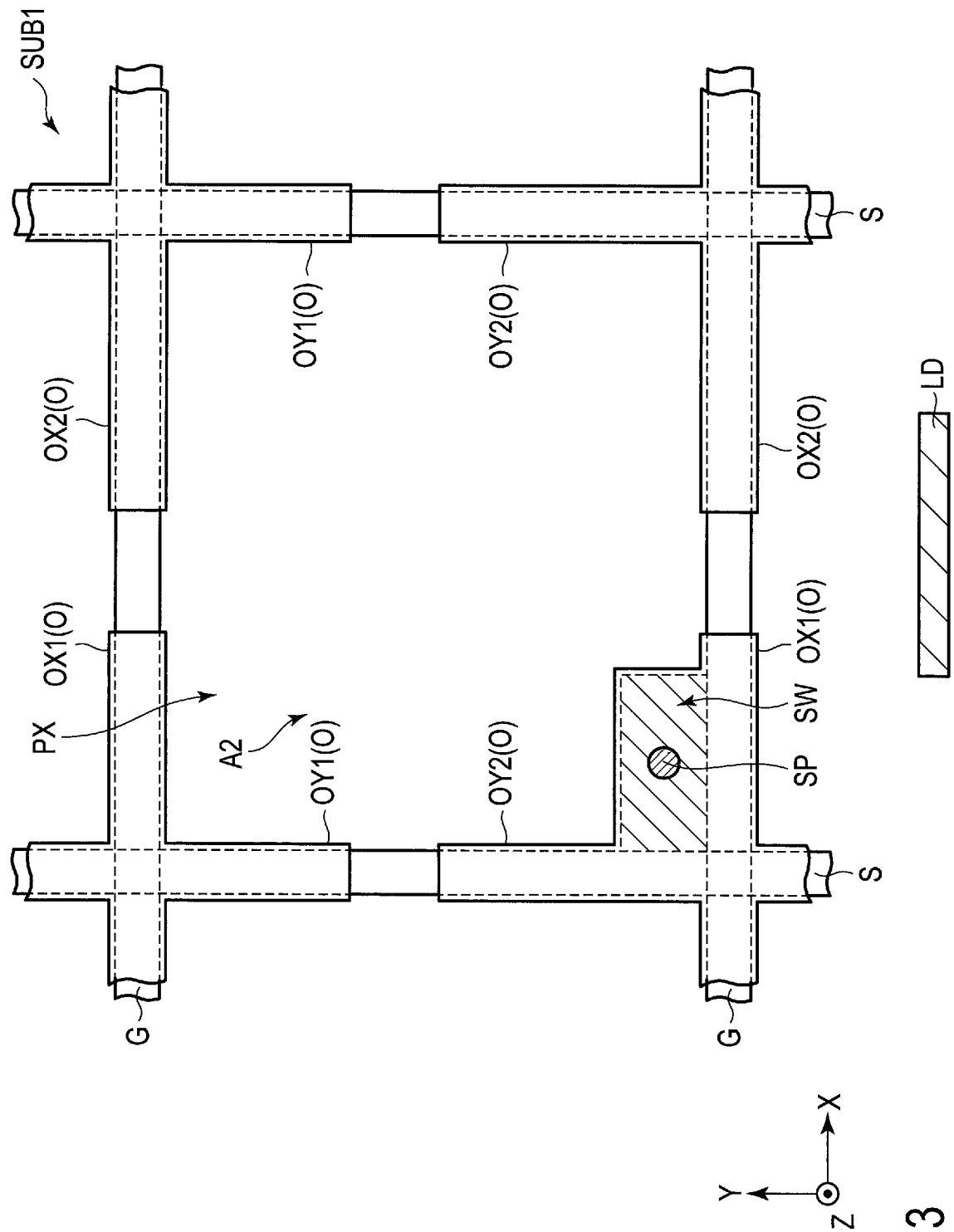
FIG. 13 is a plan view showing the seventh configuration example of the pixel PX in the first substrate SUB1.

FIG. 13 is a plan view showing the seventh configuration example of the pixel PX in the first substrate SUB1. The seventh configuration example shown in FIG. 13 differs from the first configuration example shown in FIG. 2 in that the organic insulating film O includes overlap portions OX1 and OX2 and overlap portions OY1 and OY2. The overlap portions OX1 and OX2 overlap the scanning line G. The overlap portion OX1 and the overlap portion OX2 are spaced apart from each other. That is, the organic insulating film O does not overlap the scanning line G between the overlap portion OX1 and the overlap portion OX2. The overlap portion OY1 and the overlap portion OY2 overlap the signal line S. The overlap portion OY1 and the overlap portion OY2 are spaced apart from each other. That is, the organic insulating film O does not overlap the signal line S between the overlap portion OY1 and the overlap portion OY2. The display panel PNL has the cell gap CG2 shown in FIG. 4 between the overlap portion OX1 and the overlap portion OX2 and between the overlap portion OY1 and the overlap portion OY2. As a result, in the process of manufacturing the liquid crystal layer LC, the liquid crystal material will spread more easily.

Also in the seventh configuration example, substantially the same effects as those of the above-described first configuration example can be obtained.

In the seventh configuration example, the overlap portion OX1 and the overlap portion OY1 correspond to the first overlap portion, and the overlap portion OX2 and the overlap portion OY2 correspond to the second overlap portion.

Eighth Configuration Example

Figure 14:
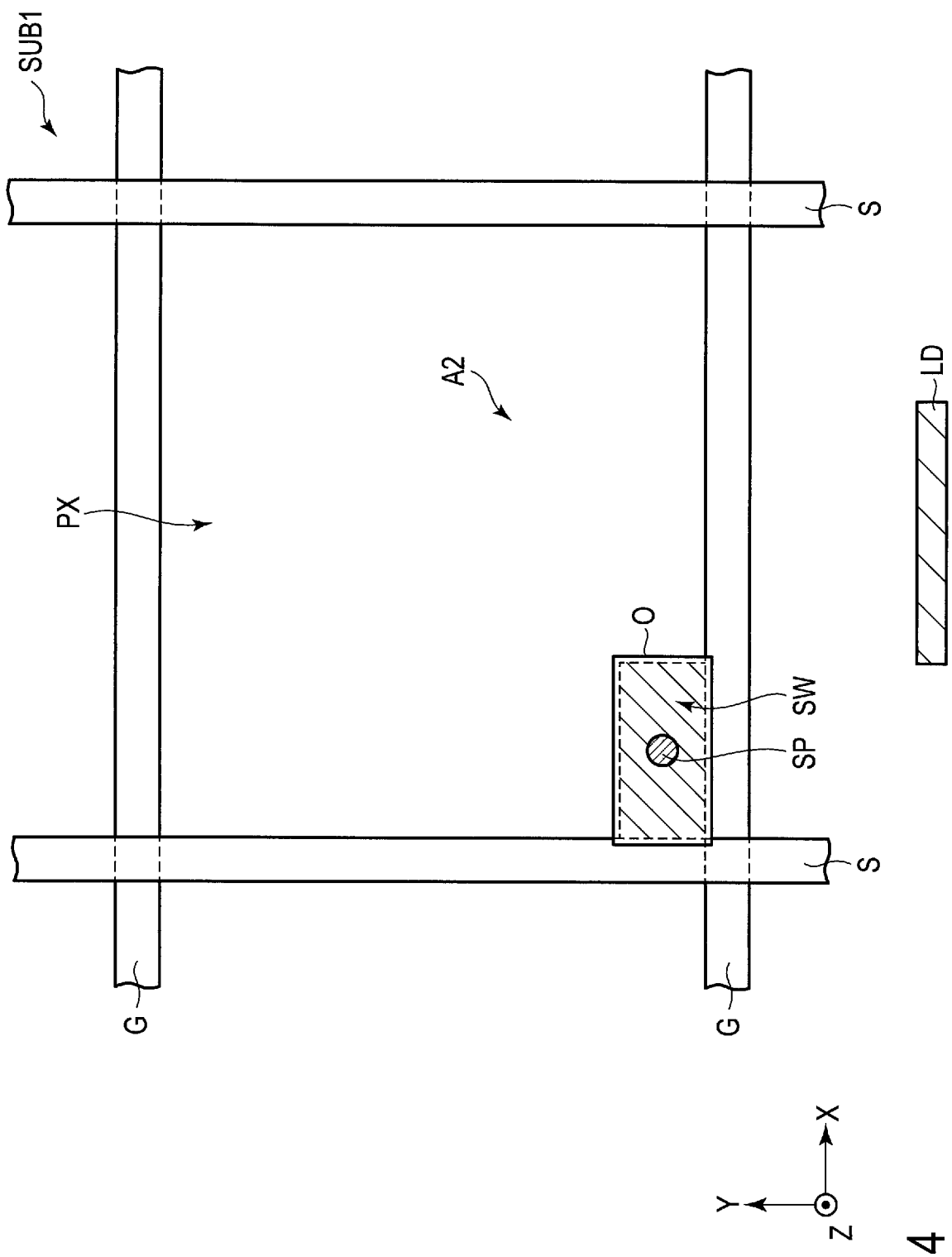
FIG. 14 is a plan view showing the eighth configuration example of the pixel PX in the first substrate SUB1.

FIG. 14 is a plan view showing the eighth configuration example of the pixel PX in the first substrate SUB1. The eighth configuration example shown in FIG. 14 differs from the first configuration example shown in FIG. 2 in that the organic insulating film O only overlaps the switching element SW.

Also in the eighth configuration example, substantially the same effects as those of the above-described first configuration example can be obtained. In addition, since the first portion OX and the second portion OY are omitted, the total volume of the organic insulating film O is further reduced, and the light absorption in the organic insulating film O is further suppressed.

Next, the effects of the present embodiment based on actual measurement will be described with reference to FIGS. 15 to 18.

FIG. 15 is an illustration for explaining a measurement method for measuring the absorptance of a sample. A light source 101 emits reference light toward a sample SA. A detector 102 measures the transmittance of light transmitted through the sample SA. A detector 103 measures the reflectance of light reflected off the sample SA. Here, the light source 101, the detector 102 and the detector 103 are installed such that an angle of incidence θi of the reference light with respect to the sample SA, an angle of transmission θt of the light transmitted through the sample SA, and an angle of reflection θr of the light reflected off the sample SA will be a predetermined value. For example, the angle of incidence θi, the angle of transmission θt and the angle of reflectance θr are equal to each other and are, for example, 5°. When the absorptance (%), the transmittance (%) and the reflectance (%) of the sample SA are referred to as A, T and R, respectively, the absorptance A can be defined as follows.

$$A=100-T-R$$

Here, it is assumed that haze of the sample SA and scattering of light in the sample SA can be ignored and the surface of the sample SA is flat.

FIG. 16 is an illustration showing results of absorptance measurement of materials used for forming the organic insulating film O. In the drawing, the horizontal axis indicates a wavelength (nm) and the vertical axis indicates an absorptance (%). The absorptance of a material used for forming the organic insulating film O of the present embodiment (sample A) and the absorptance of a material used for forming the transparent substrate of the liquid crystal display device (sample B) were measured by the measurement method described above with reference to FIG. 15. The sample A is acrylic resin, and the sample B is glass. The light emitted from the light-emitting element LD of the present embodiment consists of dominant wavelengths of 466 nm (blue wavelength), 531 nm (green wavelength) and 622 nm (red wavelength).

With regard to the sample B, light is hardly absorbed at any wavelength. On the other hand, with regard to the sample A, the absorptance on the short wavelength side tends to be higher than the absorptance on the long wavelength side. For example, in the sample A, the absorptance of the green wavelength is higher than the absorptance of the red wavelength, and the absorptance of the blue wavelength is higher than the absorptance of the green wavelength. It was confirmed that the absorptance exceeded 1% at the blue wavelength in particular. That is, the light having the blue wavelength of the light emitted from the light-emitting element LD is more likely to be absorbed in the organic insulating film O than the light having the red wavelength and the light having the green wavelength. According to the present embodiment, the total volume of the organic insulating film O is less than that of a case where the organic insulating film O is formed over the entire region of the display portion DA. Therefore, the absorption of the light having the blue wavelength in the organic insulating film O can be suppressed in particular, and undesirable chromaticity shift which occurs as a result of the differences between the absorptances of the color wavelengths of the organic insulating film O when the light propagates through the display device DSP can be suppressed, and display quality degradation can be suppressed.

FIG. 17 is an illustration showing how the light emitted from the light-emitting element LD propagates through the display device DSP. The display device DSP includes a transparent substrate 30 in addition to the display panel PNL. The transparent substrate 20 has a side surface 20C facing the light-emitting element LD. The side surface 20C corresponds to the end portion E21 of the second substrate SUB2 shown in FIG. 1. The transparent substrate 30 includes a surface (lower surface) 30A, a surface (upper surface) 30B located on the opposite side from the surface 30A, and a side surface 30C. The surfaces 30A and 30B are surfaces substantially parallel to the X-Y plane. The surface 30A faces the surface 20B of the transparent substrate 20. The surface 30B is in contact with an air layer, for example. The side surface 30C faces the light-emitting element LD and overlaps the side surface 20C. The transparent substrate 30 is bonded to the transparent substrate 20 by a transparent adhesive layer AD. The adhesive layer AD is in contact with the surfaces 30A and 20B.

As indicated by arrows in the drawing, the light emitted from the light-emitting element LD is attenuated as the distance from an incidence portion, that is, from the side surface 20C and the side surface 30C increases. Since the light absorptance in glass used for forming the transparent substrate 10, the transparent substrate 20, the transparent substrate 30 and the like is less than 0.1% as shown in FIG. 16, the main cause of the attenuation of the emitted light is considered to be light absorption in various thin films between the transparent substrate 10 and the transparent substrate 20 and between the transparent substrate 20 and the transparent substrate 30.

Figure 18:
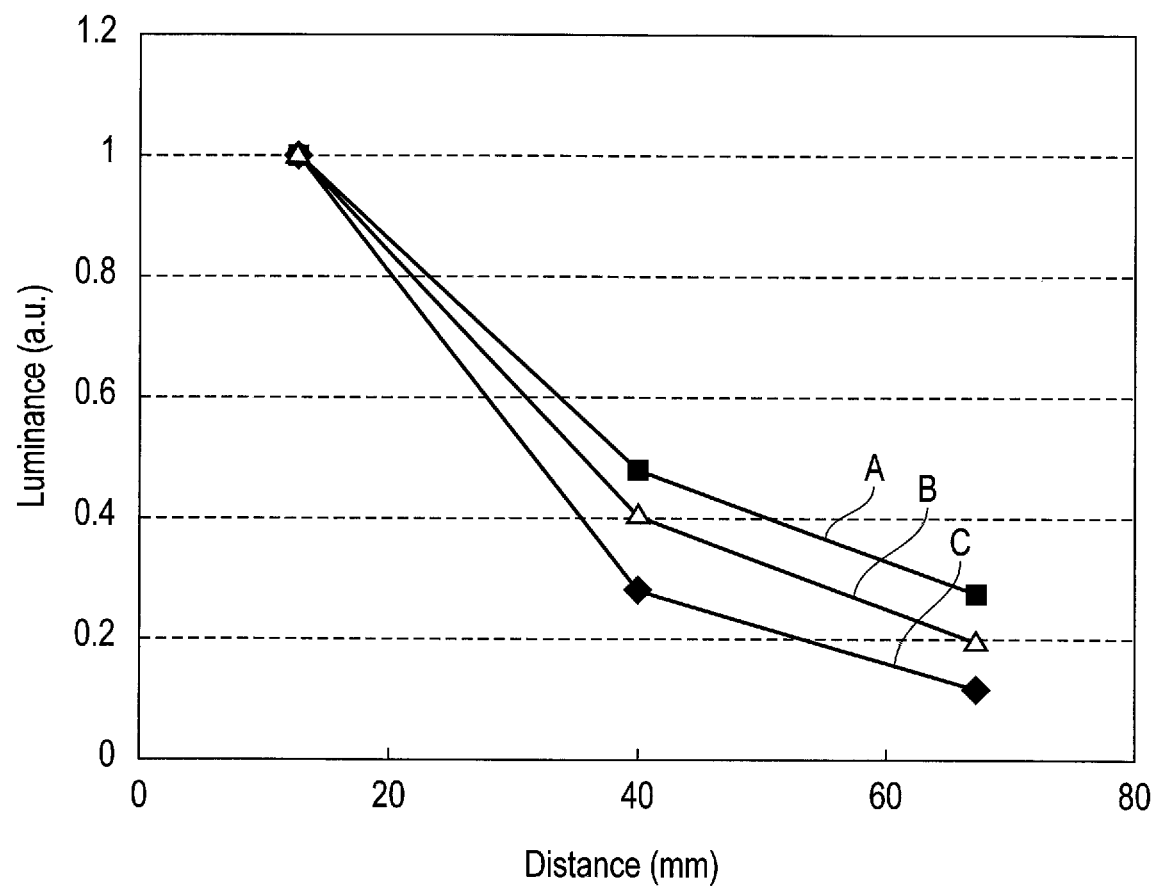
FIG. 18 is an illustration showing results of luminance measurement in the display device DSP of the present embodiment and display devices of comparative examples.

FIG. 18 is an illustration showing results of luminance measurement in the display device DSP of the present embodiment and display devices of comparative examples. In a display device of a comparative example (C), the organic insulating film O is arranged over substantially the entire region of the first substrate SUB1, and the scanning line G is formed of a layered product of molybdenum (Mo), aluminum (Al) and molybdenum (Mo). In a display device of a comparative example (B), the organic insulating film O is arranged over substantially the entire region of the first substrate SUB1, and the scanning line G is formed of a layered product of molybdenum (Mo) and aluminum (Al). In the display device DSP of the present embodiment (A), as described above, the organic insulating film O is in the form of a grid, and the scanning line G is formed of a layered product of molybdenum (Mo) and aluminum (Al). The luminance of each display device was measured at different distances from the incidence portion. The incidence portion corresponds to the side surface 20C and the side surface 30C shown in FIG. 17. In FIG. 18, the horizontal axis indicates a distance from the incidence portion and the vertical axis indicates an absolute value of luminance. As shown in FIG. 18, in the display device DSP of the present embodiment (A), as compared to the display device of the comparative example (B), the total volume of the organic insulating film O is small, and therefore it was confirmed that luminance reduction was small even at a large distance from the incidence portion and that light attenuation could be suppressed by about 8%. In addition, in the display device DSP of the present embodiment (A), as compared to the display device of the comparative example (C), the total volume of the organic insulating film O is small and the structure of the layered product of the scanning line G is different, and therefore it was confirmed that luminance reduction was small even at a large distance from the incidence portion and that light attenuation could be suppressed by about 16%.

As described above, according to the present embodiment, a display device which can suppress display quality degradation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Examples of the display devices which can be obtained from the configurations described in the present specification will be additionally described below.

(1) A display device comprising:
a first substrate;
a second substrate;
a liquid crystal layer located between the first substrate and the second substrate and including polymers and liquid crystal molecules; and
a light-emitting element, wherein
the first substrate comprises a transparent substrate, a scanning line, a signal line crossing the scanning line, a switching element electrically connected to the scanning line and the signal line, an organic insulating film overlapping the switching element, and a pixel electrode electrically connected to the switching element, and
a thickness of the organic insulating film located between the transparent substrate and the pixel electrode is less than a thickness of the organic insulating film overlapping the switching element.

(2) The display device of item (1), wherein
the first substrate comprises:
an inorganic insulating film located between the transparent substrate and the pixel electrode; and
a capacitance electrode located between the inorganic insulating film and the pixel electrode,
the organic insulating film is located between the inorganic insulating film and the capacitance electrode, and
the capacitance electrode is in contact with the organic insulating film.

(3) The display device of item (2), wherein
the first substrate comprises a metal line electrically connected to the capacitance electrode, and
the organic insulating film is located in at least one of a location between the scanning line and the metal line and a location between the signal line and the metal line.

(4) A display device comprising:
a first substrate;
a second substrate;
a liquid crystal layer located between the first substrate and the second substrate and including polymers and liquid crystal molecules; and
a light-emitting element, wherein
the first substrate comprises a transparent substrate, a scanning line, a signal line crossing the scanning line, a switching element electrically connected to the scanning line and the signal line, an organic insulating film overlapping the switching element, and a pixel electrode electrically connected to the switching element, and
the organic insulating film is not between the transparent substrate and the pixel electrode.

(5) The display device of item (4), wherein
the first substrate comprises:
an inorganic insulating film located between the transparent substrate and the pixel electrode; and
a capacitance electrode located between the inorganic insulating film and the pixel electrode, and
the capacitance electrode is in contact with an upper surface of the inorganic insulating film.

(6) The display device of item (5), wherein
the first substrate comprises a metal line electrically connected to the capacitance electrode, and
the organic insulating film is located in at least one of a location between the scanning line and the metal line and a location between the signal line and the metal line.

(7) The display device of any one of items (1) to (6), wherein
the second substrate comprises a light-shielding layer overlapping the switching element,
the organic insulating film comprises a first side surface located close to the light-emitting element and a second side surface located on an opposite side from the first side surface, and
the light-shielding layer overlaps the second side surface.

(8) The display device of item (7), wherein
the second substrate comprises a common electrode, and
the light-shielding layer is a conductive layer having resistance lower than that of the common electrode and is electrically connected to the common electrode.

(9) The display device of one of items (7) and (8), further comprising a spacer located between the organic insulating film and the light-shielding layer.

(10) The display device of any one of items (1) to (9), wherein the organic insulating film overlaps at least one of the scanning line and the signal line in a planar view.

(11) The display device of item (10), wherein
the organic insulating film comprises a first overlap portion and a second overlap portion which overlap the scanning line or the signal line, and
the first overlap portion and the second overlap portion are spaced apart from each other.

What is claimed is:

1. A display device comprising:
a first substrate;
a second substrate;
a liquid crystal layer located between the first substrate and the second substrate and including streaky polymers and liquid crystal molecules; and
a light-emitting element, wherein
the first substrate comprises a transparent substrate, a scanning line, a signal line crossing the scanning line, a switching element electrically connected to the scanning line and the signal line, an organic insulating film, and a pixel electrode electrically connected to the switching element,
the organic insulating film is formed of a transparent organic insulating material,
the organic insulating film comprises a first portion overlapping the scanning line, the signal line, and the switching element, and a second portion located between the transparent substrate and the pixel electrode,
the first portion is formed in a frame shape in a planar view,
a side surface of the first portion is formed along an end of the pixel electrode and surrounds the pixel electrode,
a thickness of the second portion is less than a thickness of the first portion,
the liquid crystal layer includes a first cell gap directly above the first portion and a second cell gap directly above the second portion,
the first cell gap and the second cell gap are thicknesses of the liquid crystal layer including streaky polymers and liquid crystal molecules, the first cell gap is less than the second cell gap, and
an area of the first portion of the organic insulating film is smaller than an area of a second portion of the organic insulating film in a planar view wherein the first portion of the organic insulating film and the pixel electrode are spaced apart from each other in a planar view; wherein the first substrate comprises: an inorganic insulating film located between the transparent substrate and the pixel electrode; and a capacitance electrode located between the inorganic insulating film and the pixel electrode, the organic insulating film is located between the inorganic insulating film and the capacitance electrode, and the capacitance electrode is in contact with the side surface of the first portion and an upper surface of the second portion; and wherein the side surface of the first portion is covered with the capacitance electrode.

2. The display device of claim 1, wherein
the first substrate comprises a metal line electrically connected to the capacitance electrode, and
the metal line is disposed on an upper surface of the first portion,
the organic insulating film is located in at least one of a location between the scanning line and the metal line and a location between the signal line and the metal line.

3. A display device comprising:
a first substrate;
a second substrate;
a liquid crystal layer located between the first substrate and the second substrate and including streaky polymers and liquid crystal molecules; and
a light-emitting element, wherein
the first substrate comprises a transparent substrate, a scanning line, a signal line crossing the scanning line, a switching element electrically connected to the scanning line and the signal line, an organic insulating film, and a pixel electrode electrically connected to the switching element,
the organic insulating film is formed of a transparent organic insulating material,
the organic insulating film overlaps the scanning line, the signal line, and the switching element, and does not exist between the transparent substrate and the pixel electrode,
the organic insulating film is formed in a frame shape in a planar view,
a side surface of the organic insulating film is formed along an end of the pixel electrode and surrounds the pixel electrode,
an area of a first region where the organic insulating film exists is smaller than an area of a second region where the organic insulating film does not exist in a planar view,
the liquid crystal layer includes a first cell gap in the first region where the organic insulating film exists and a second cell gap in the second region where the organic insulating film does not exist,
the first cell gap and the second cell gap are thicknesses of the liquid crystal layer including streaky polymers and liquid crystal molecules, and
the first cell gap is less than the second cell gap wherein the organic insulating film and the pixel electrode are spaced apart from each other in a planar view; an inorganic insulating film located between the transparent substrate and the pixel electrode; and a capacitance electrode located between the inorganic insulating film and the pixel electrode, and the capacitance electrode is in contact with the side surface of the organic insulating film and an upper surface of the inorganic insulating film; and wherein the side surface of the organic insulating film is covered with the capacitance electrode.

4. The display device of claim 3, wherein
the first substrate comprises a metal line electrically connected to the capacitance electrode,
the metal line is disposed on an upper surface of the organic insulating film, and
the organic insulating film is located in at least one of a location between the scanning line and the metal line and a location between the signal line and the metal line.

5. The display device of claim 1, wherein
the second substrate comprises a light-shielding layer overlapping the switching element,
the organic insulating film comprises a first side surface located close to the light-emitting element and a second side surface located on an opposite side from the first side surface, and
the light-shielding layer overlaps the second side surface.

6. The display device of claim 5, wherein
the second substrate comprises a common electrode, and
the light-shielding layer is a conductive layer having resistance lower than that of the common electrode and is electrically connected to the common electrode.

7. The display device of claim 5, further comprising a spacer located between the organic insulating film and the light-shielding layer.

8. The display device of claim 3, wherein
the second substrate comprises a light-shielding layer overlapping the switching element,
the organic insulating film comprises a first side surface located close to the light-emitting element and a second side surface located on an opposite side from the first side surface, and
the light-shielding layer overlaps the second side surface.

9. The display device of claim 8, wherein
the second substrate comprises a common electrode, and
the light-shielding layer is a conductive layer having resistance lower than that of the common electrode and is electrically connected to the common electrode.

10. The display device of claim 8, further comprising a spacer located between the organic insulating film and the light-shielding layer.

* * * * *